(12) United States Patent
Vukkadala et al.

(10) Patent No.: US 11,682,570 B2
(45) Date of Patent: *Jun. 20, 2023

(54) PROCESS-INDUCED DISPLACEMENT CHARACTERIZATION DURING SEMICONDUCTOR PRODUCTION

(71) Applicant: KLA Corporation, Milpitas, CA (US)

(72) Inventors: Pradeep Vukkadala, Newark, CA (US); Mark D. Smith, San Jose, CA (US); Ady Levy, San Jose, CA (US); Prasanna Dighe, San Ramon, CA (US); Dieter Mueller, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/479,744

(22) Filed: Sep. 20, 2021

(65) Prior Publication Data

US 2022/0005714 A1 Jan. 6, 2022

Related U.S. Application Data

(63) Continuation of application No. 16/019,341, filed on Jun. 26, 2018, now Pat. No. 11,164,768.
(Continued)

(51) Int. Cl.
*H01L 21/67* (2006.01)
*H01L 21/66* (2006.01)
(Continued)

(52) U.S. Cl.
CPC .... *H01L 21/67253* (2013.01); *G01B 11/0675* (2013.01); *G01N 21/45* (2013.01);
(Continued)

(58) Field of Classification Search
CPC ......... H01L 21/67253; H01L 21/67276; H01L 21/67017; H01L 21/0337; H01L 22/20;
(Continued)

(56) References Cited

U.S. PATENT DOCUMENTS 5,805,278 A 9/1998 Danko
5,963,315 A 10/1999 Hiatt et al.
(Continued)

FOREIGN PATENT DOCUMENTS

KR 101256923 B1 4/2013
TW 201604020 A 2/2016

OTHER PUBLICATIONS

Brunner, T. A. et al., "Characterization of Wafer Geometry and Overlay Error on Silicon Wafers with Nonuniform Stress", Journal of Micro/Nanolithography, MEMS, and MOEMS (JM3) 0001, 12(4):043002-043002, 2013.
(Continued)

*Primary Examiner* — M. N. Von Buhr
(74) *Attorney, Agent, or Firm* — Suiter Swantz pc llo

(57) ABSTRACT

A controller is configured to perform at least a first characterization process prior to at least one discrete backside film deposition process on a semiconductor wafer; perform at least an additional characterization process following the at least one discrete backside film deposition process; determine at least one of a film force or one or more in-plane displacements for at least one discrete backside film deposited on the semiconductor wafer via the at least one discrete backside film deposition process based on the at least the first characterization process and the at least the additional characterization process; and provide at least one of the film force or the one or more in-plane displacements to at least one process tool via at least one of a feed forward loop or a feedback loop to improve performance of one or more fabrication processes.

27 Claims, 17 Drawing Sheets

Related U.S. Application Data

(60) Provisional application No. 62/663,865, filed on Apr. 27, 2018.

(51) Int. Cl.
| | |
|---|---|
| *G01B 11/06* | (2006.01) |
| *G01N 21/45* | (2006.01) |
| *G03F 7/20* | (2006.01) |
| *G05B 19/4097* | (2006.01) |
| *G03F 7/00* | (2006.01) |

(52) U.S. Cl.
CPC ..... *G03F 7/70483* (2013.01); *G05B 19/4097* (2013.01); *H01L 22/20* (2013.01); *G01B 2210/56* (2013.01); *G05B 2219/45031* (2013.01)

(58) Field of Classification Search
CPC ............ G01B 11/0675; G01B 2210/56; G03F 7/70483; G03F 7/70608; G03F 7/70616; G03F 7/70633; G05B 19/4097; G05B 2219/45031; G01N 21/45; G01N 21/9501; C23C 16/44
See application file for complete search history.

(56) References Cited

U.S. PATENT DOCUMENTS

| | | | |
|---|---|---|---|
| 6,031,611 A | 2/2000 | Rosakis et al. | |
| 6,621,570 B1 | 9/2003 | Danko | |
| 6,724,476 B1 | 4/2004 | Phan et al. | |
| 6,847,458 B2 * | 1/2005 | Freischlad | G01B 9/02028 356/511 |
| 7,092,082 B1 | 8/2006 | Dardzinski | |
| 7,369,251 B2 | 5/2008 | Rosakis et al. | |
| 7,847,954 B2 | 12/2010 | Tang et al. | |
| 7,930,113 B1 | 4/2011 | Huang et al. | |
| 7,966,135 B2 | 6/2011 | Rosakis et al. | |
| 8,068,234 B2 | 11/2011 | Tang et al. | |
| 8,111,376 B2 | 2/2012 | Mel et al. | |
| 8,847,458 B2 | 9/2014 | Besnerais | |
| 9,354,526 B2 * | 5/2016 | Vukkadala | G01B 11/2441 |
| 9,354,926 B2 | 5/2016 | King-Smith et al. | |
| 9,779,202 B2 | 10/2017 | Vukkadala et al. | |
| 11,164,768 B2 * | 11/2021 | Vukkadala | G03F 7/70633 |
| 2005/0038554 A1 | 2/2005 | Watkins | |
| 2005/0151969 A1 | 7/2005 | Ke et al. | |
| 2007/0105029 A1 | 5/2007 | Ausschnitt | |
| 2008/0204730 A1 | 8/2008 | Yu et al. | |
| 2008/0286885 A1 | 11/2008 | Izikson et al. | |
| 2010/0141948 A1 | 6/2010 | Cohen et al. | |
| 2012/0019707 A1 | 1/2012 | Lumondiere et al. | |
| 2012/0120379 A1 | 5/2012 | Phillips et al. | |
| 2013/0041494 A1 | 2/2013 | Ausschnitt et al. | |
| 2013/0182263 A1 | 7/2013 | Shchegrov et al. | |
| 2014/0019097 A1 | 1/2014 | Bakeman et al. | |
| 2014/0293291 A1 | 10/2014 | Tang | |
| 2015/0048741 A1 | 2/2015 | Shortt et al. | |
| 2015/0120216 A1 | 4/2015 | Vukkadala et al. | |
| 2015/0333471 A1 | 11/2015 | Chimmalgi et al. | |
| 2015/0363536 A1 | 12/2015 | Chidambarrao et al. | |
| 2016/0372353 A1 | 12/2016 | Vukkadala et al. | |
| 2017/0148690 A1 | 5/2017 | Broadway | |
| 2017/0162456 A1 | 6/2017 | Owen | |
| 2017/0278236 A1 | 9/2017 | Li et al. | |
| 2018/0067403 A1 | 3/2018 | deVilliers | |
| 2018/0096906 A1 | 4/2018 | Levy et al. | |
| 2018/0112968 A1 | 4/2018 | Chen et al. | |
| 2018/0113084 A1 | 4/2018 | Hench et al. | |
| 2019/0033838 A1 | 1/2019 | Duffy | |
| 2019/0041329 A1 | 2/2019 | Hill et al. | |
| 2019/0331592 A1 | 10/2019 | Dighe et al. | |
| 2019/0361358 A1 | 11/2019 | Tel et al. | |

OTHER PUBLICATIONS

Brunner, T. A. et al., "Patterned wafer Geometry (PWG) Metrology for Improving Process-Induced Overlay and Focus Problems", Proceedings of SPIE, vol. 9780, p. 97800W, 2016.
Gong, J. et al., "Determining Local Residual Stresses from High Resolution Wafer Geometry Measurements", Journal of Vacuum Science & Technology B (JVST B) 31, 050205, 2013.
Goodfellow, I. et al., "Deep Learning", The MIT Press, 2016.
International Search Report dated Apr. 26, 2019 for PCT/US2018/066628.
Owen, D., "Stress Inspection for Overlay Characterization", Proceedings of SPIE, vol. 8681, p. 86812T, 2013.
Turner, K. T. et al., "Models to Relate Wafer Geometry Measurements to In-Plane Distortion of Wafers", Journal of Micro/Nanolithography, MEMS, and MOEMS (JM3), 15(2), p. 021404, 2016.
Turner, K. T. et al., "Monitoring Process-Induced Overlay Errors Through High Resolution Wafer Geometry Measurements", Proceedings of SPIE, vol. 9050, p. 905013, 2014.
Turner, K. T. et al., "Predicting Distortions and Overlay Errors Due to Wafer Deformation During Chucking on Lithography Scanners", Journal of Micro/Nanolithography, MEMS, and MOEMS (JM3), 8(4), p. 043015, 2010.
Office Action in Taiwan Application No. 108113731 dated Sep. 5, 2022, 28 pages.

* cited by examiner

PROCESS-INDUCED DISPLACEMENT CHARACTERIZATION DURING SEMICONDUCTOR PRODUCTION

CROSS-REFERENCE TO RELATED APPLICATIONS

The present application is a continuation of and claims priority to U.S. patent application Ser. No. 16/019,341, filed Jun. 26, 2018, which issued as U.S. patent Ser. No. 11/164,768 on Nov. 2, 2021 and claims priority to U.S. Provisional Patent Application Ser. No. 62/663,865, filed Apr. 27, 2018, which are incorporated herein by reference in the entirety.

TECHNICAL FIELD

The present invention generally relates to semiconductor device production and, more particularly, to process-induced displacement characterization during semiconductor production.

BACKGROUND

The fabrication of semiconductor devices, such as logic and memory devices, typically includes processing a semiconductor device using a large number of fabrication processes and characterization processes to form various features and multiple layers of the semiconductor device. Select fabrication processes utilize photomasks/reticles to print features on a semiconductor device such as a wafer. As semiconductor devices become smaller and smaller laterally and extended vertically, it becomes critical to develop enhanced characterization processes with increased sensitivity and throughput.

One semiconductor device fabrication technology includes fabricating the semiconductor device via deposition of film stacks to form layers on one or more surfaces. Semiconductor devices are typically fabricated to meet a selected set of device shape and/or size requirements (e.g., wafer flatness or wafer thickness). Variation in the film force/stress of deposited films may induce in-plane displacement/distortion (IPD) of the semiconductor device, which may be characterized as overlay errors.

One way to monitor and control film force/stress-induced IPD include characterizing changes in wafer geometry and applying plate theory to convert the characterizations into overlay errors. Traditional wafer geometry processes include making two characterizations of the semiconductor device. The first characterization occurs at the beginning of a layer, prior to a first fabrication process (e.g., lithography). The second characterization occurs at the end of the layer, prior to a second fabrication process (e.g., lithography). With these two characterizations, the overall change in wafer geometry for the layer may be determined.

This traditional approach is usable for a set of fabrication processes that only induce changes in film force/stress on a frontside film (e.g., discrete frontside film processes). In addition, the traditional approach is usable for a set of fabrication processes that only induce changes in film force/stress on a backside film (e.g., discrete backside film processes). The traditional approach is not usable for a set of fabrication processes that induces changes in film force/stress on a frontside film and a backside film (e.g., concurrent frontside film processes and backside film processes), however, as the approach is not able to take residually-stressed concurrent changes into account when determining overlay error (e.g., residual backside film changes to frontside film processes, or vice versa). In this regard, accuracy of overlay error estimation is significantly degraded.

Therefore, it would be advantageous to provide a system and method that cures the shortcomings described above.

SUMMARY

A system is disclosed in accordance with one or more illustrative embodiments of the present disclosure. In one illustrative embodiment, the system includes a controller. In another illustrative embodiment, the controller performs a first wafer geometry characterization process via at least one tool of one or more characterization sub-systems prior to a first lithography process on a semiconductor wafer. In another illustrative embodiment, the controller performs at least one characterization process via at least one reflection-mode characterization tool of the one or more characterization sub-systems following the first lithography process and prior to at least one discrete backside film deposition process on the semiconductor wafer, where the at least one characterization process includes at least one of a film property characterization process or an intensity spectra characterization process. In another illustrative embodiment, the controller performs at least one additional characterization process via at least one reflection-mode characterization tool of the one or more characterization sub-systems following the at least one discrete backside film deposition process on the semiconductor wafer and prior to a second lithography process, where the at least one additional characterization process includes at least one of a film property characterization process or an intensity spectra characterization process. In another illustrative embodiment, the controller performs a second wafer geometry characterization process via at least one tool of the one or more characterization sub-systems prior to the second lithography process on the semiconductor wafer. In another illustrative embodiment, the controller determines at least one of a film force or one or more in-plane displacements for at least one discrete backside film deposited on the semiconductor wafer via the at least one discrete backside film deposition process based on at least one of the first wafer geometry characterization process, the at least one characterization process, the at least one additional characterization process, or the second wafer geometry characterization process. In another illustrative embodiment, the controller provides at least one of the film force or the one or more in-plane displacements to at least one process tool via at least one of a feed forward loop or a feedback loop to improve performance of one or more fabrication processes.

A system is disclosed in accordance with one or more illustrative embodiments of the present disclosure. In one illustrative embodiment, the system includes one or more characterization sub-systems. In another illustrative embodiment, the system includes a controller. In another illustrative embodiment, the controller performs a first wafer geometry characterization process via at least one tool of the one or more characterization sub-systems prior to a first lithography process on a semiconductor wafer. In another illustrative embodiment, the controller performs at least one characterization process via at least one reflection-mode characterization tool of the one or more characterization sub-systems following the first lithography process and prior to at least one discrete backside film deposition process on the semiconductor wafer, where the at least one characterization process includes at least one of a film property characterization process or an intensity spectra characterization process. In another illustrative embodiment, the controller performs at least one additional characterization process via at least one reflection-mode characterization tool of the one or more characterization sub-systems following the at least one discrete backside film deposition process on the semiconductor wafer and prior to a second lithography process, where the at least one additional characterization process includes at least one of a film property characterization process or an intensity spectra characterization process. In another illustrative embodiment the controller performs a second wafer geometry characterization process via at least one tool of the one or more characterization sub-systems prior to the second lithography process on the semiconductor wafer. In another illustrative embodiment, the controller determines at least one of a film force or one or more in-plane displacements for at least one discrete backside film deposited on the semiconductor wafer via the at least one discrete backside film deposition process based on at least one of the first wafer geometry characterization process, the at least one characterization process, the at least one additional characterization process, or the second wafer geometry characterization process. In another illustrative embodiment, the controller provides at least one of the film force or the one or more in-plane displacements to at least one process tool via at least one of a feed forward loop or a feedback loop to improve performance of one or more fabrication processes.

A method is disclosed in accordance with one or more illustrative embodiments of the present disclosure. In one illustrative embodiment, the method includes performing a first wafer geometry characterization process via at least one tool of one or more characterization sub-systems prior to a first lithography process on a semiconductor wafer. In another illustrative embodiment, the method includes performing at least one characterization process via at least one reflection-mode characterization tool of the one or more characterization sub-systems following the first lithography process and prior to at least one discrete backside film deposition process on the semiconductor wafer, where the at least one characterization process includes at least one of a film property characterization process or an intensity spectra characterization process. In another illustrative embodiment, the method includes performing at least one additional characterization process via at least one reflection-mode characterization tool of the one or more characterization sub-systems following the at least one discrete backside film deposition process on the semiconductor wafer and prior to a second lithography process, where the at least one additional characterization process includes at least one of a film property characterization process or an intensity spectra characterization process. In another illustrative embodiment, the method includes performing a second wafer geometry characterization process via at least one tool of the one or more characterization sub-systems prior to the second lithography process on the semiconductor wafer. In another illustrative embodiment, the method includes determining at least one of a film force or one or more in-plane displacements for at least one discrete backside film deposited on the semiconductor wafer via the at least one discrete backside film deposition process based on at least one of the first wafer geometry characterization process, the at least one characterization process, the at least one additional characterization process, or the second wafer geometry characterization process. In another illustrative embodiment, the method includes providing at least one of the film force or the one or more in-plane displacements to at least one process tool via at least one of a feed forward loop or a feedback loop to improve performance of one or more fabrication processes.

BRIEF DESCRIPTION OF THE DRAWINGS

The numerous advantages of the present disclosure may be better understood by those skilled in the art by reference to the accompanying figures in which.

DETAILED DESCRIPTION OF THE INVENTION

Reference will now be made in detail to the subject matter disclosed, which is illustrated in the accompanying drawings.

Referring generally to FIGS. 1-11B, a system and method for process-induced displacement characterization during semiconductor production is disclosed, in accordance with one or more embodiments of the present disclosure.

Embodiments of the present disclosure are directed to a system and method for process-induced displacement characterization during semiconductor production. Embodiments of the present disclosure are directed to estimating in-plane displacements/distortions (IPDs) induced by film processes via one or more of wafer geometry characterization processes, film properties characterization processes, and/or intensity spectra characterization processes during semiconductor fabrication. Embodiments of the present disclosure are also directed to improving cycle time via integration of characterization techniques and subsequent elimination of characterization at multiple steps, allowing for the characterization of multiple stacks of films in a single characterization process. Embodiments of the present disclosure are also directed to controlling process tools and/or characterization tools based on an estimated film force and/or in-plane displacements.

Figure 1:
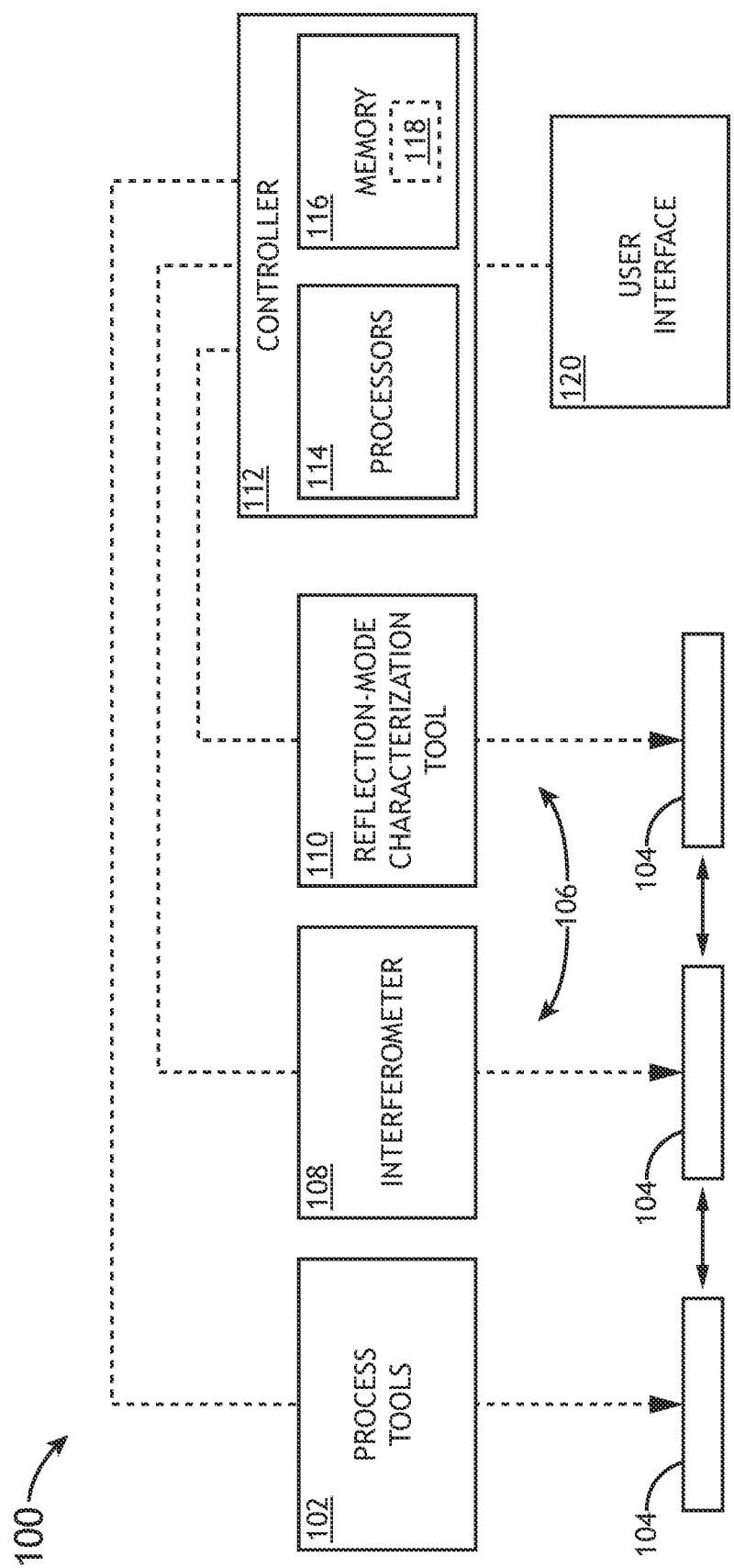
FIG. 1 illustrates a simplified block diagram of a system for process-induced displacement characterization during semiconductor production, in accordance with one or more embodiments of the present disclosure.
Figure 2A:
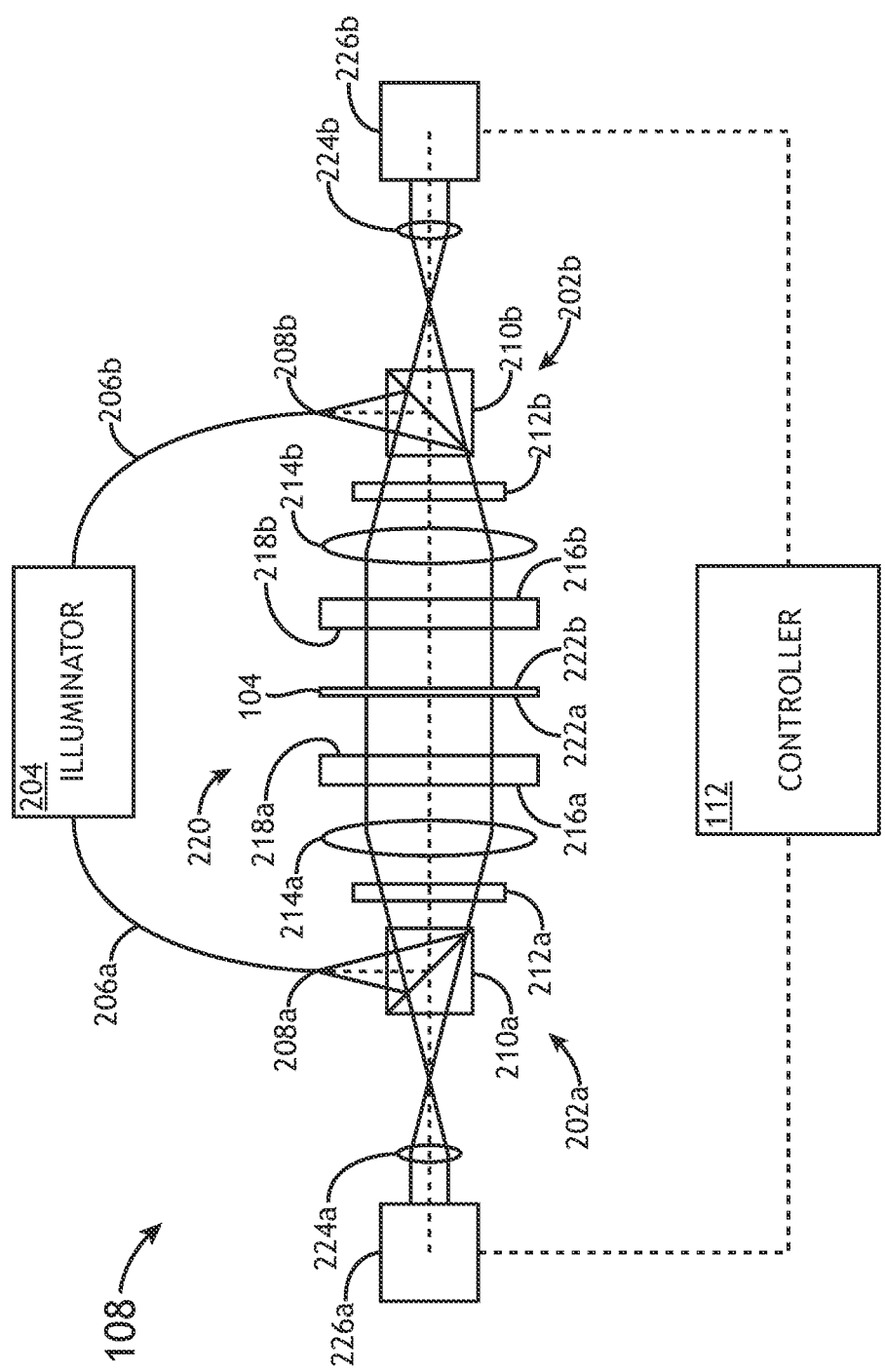
FIG. 2A illustrates a simplified schematic view of an interferometer tool of a system for process-induced displacement characterization during semiconductor production, in accordance with one or more embodiments of the present disclosure.
Figure 2B:
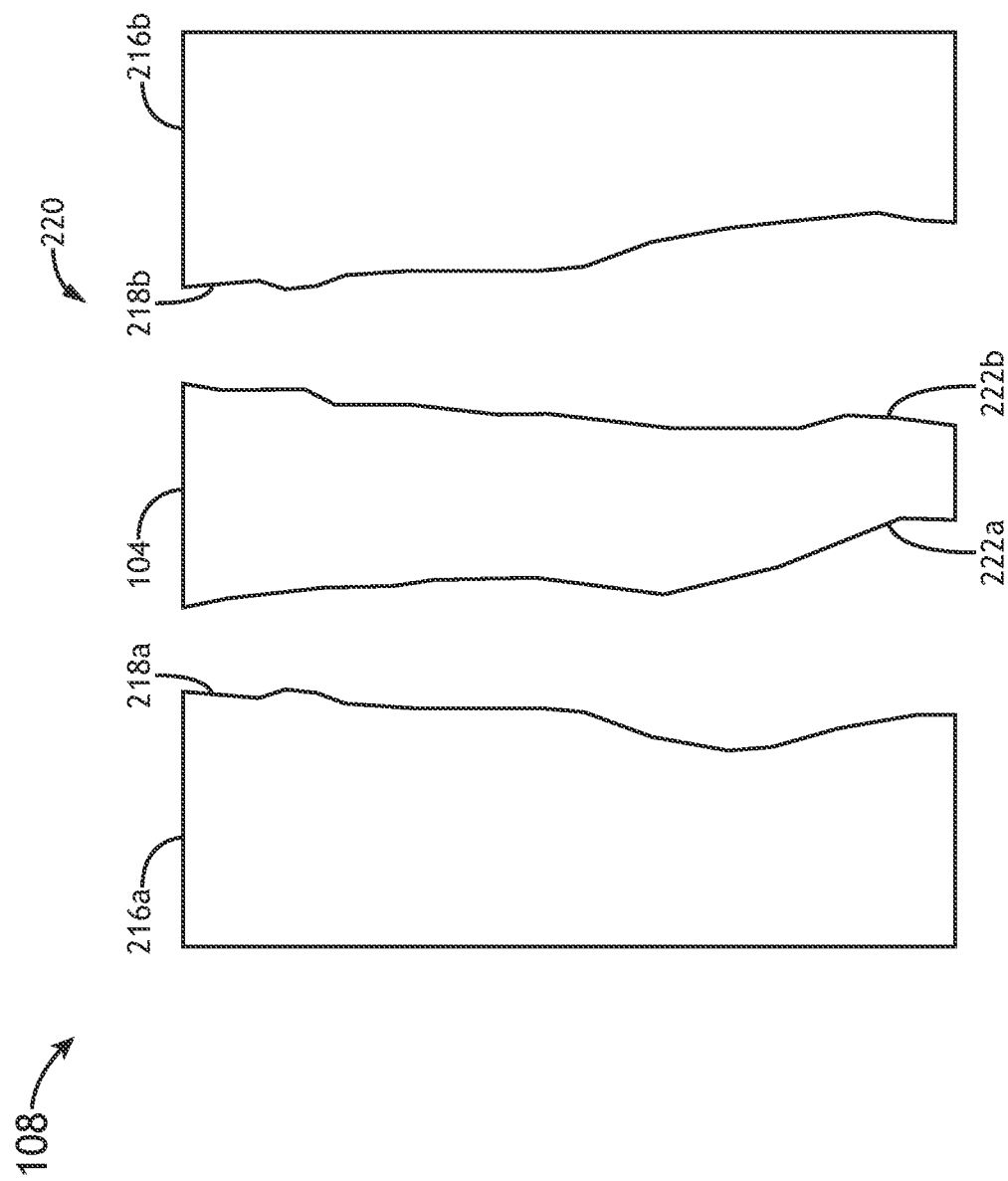
FIG. 2B illustrates a simplified schematic view of a cavity of an interferometer tool of a system for process-induced displacement characterization during semiconductor production, in accordance with one or more embodiments of the present disclosure.
Figure 2C:
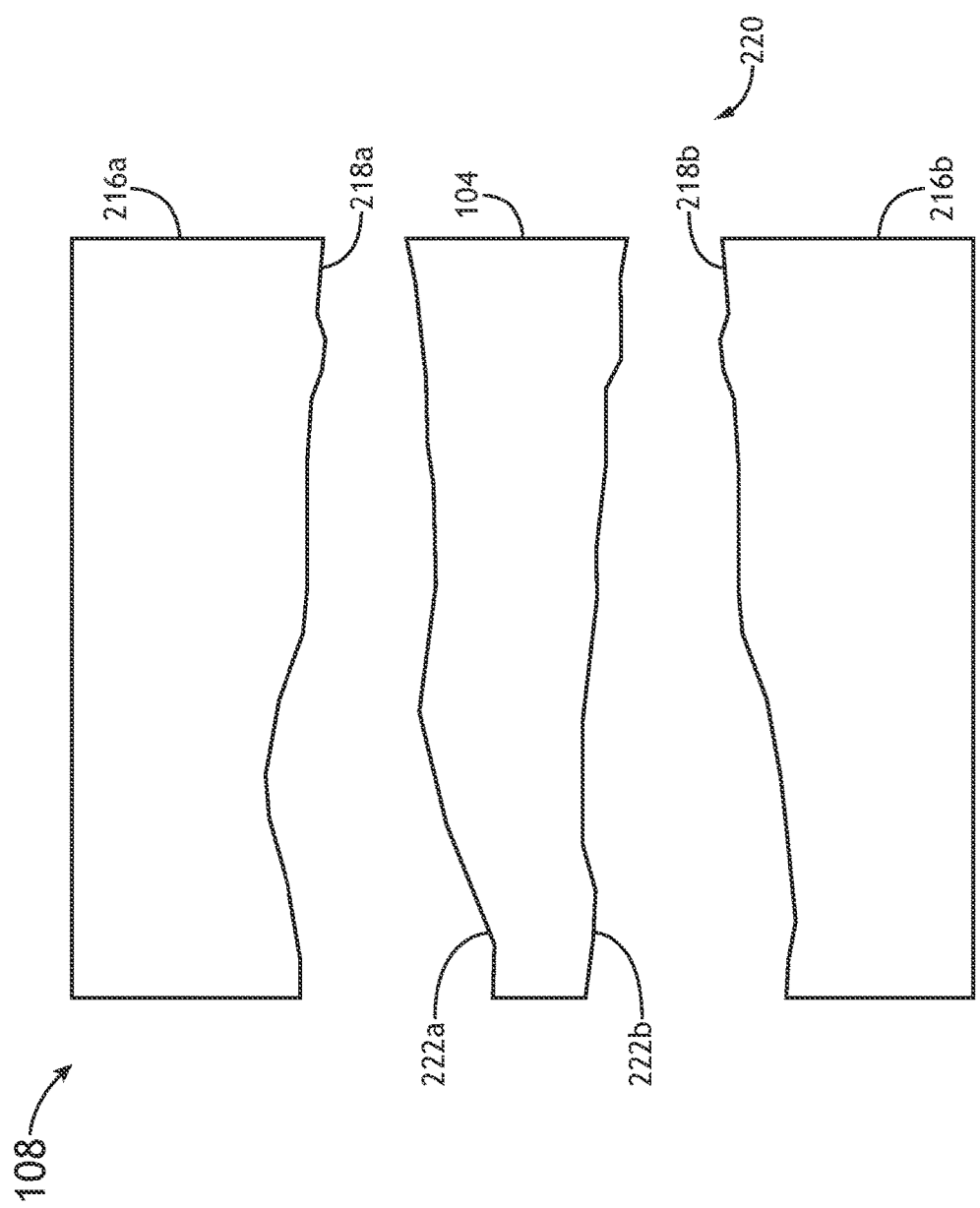
FIG. 2C illustrates a simplified schematic view of a cavity of an interferometer tool of a system for process-induced displacement characterization during semiconductor production, in accordance with one or more embodiments of the present disclosure.
Figure 3:
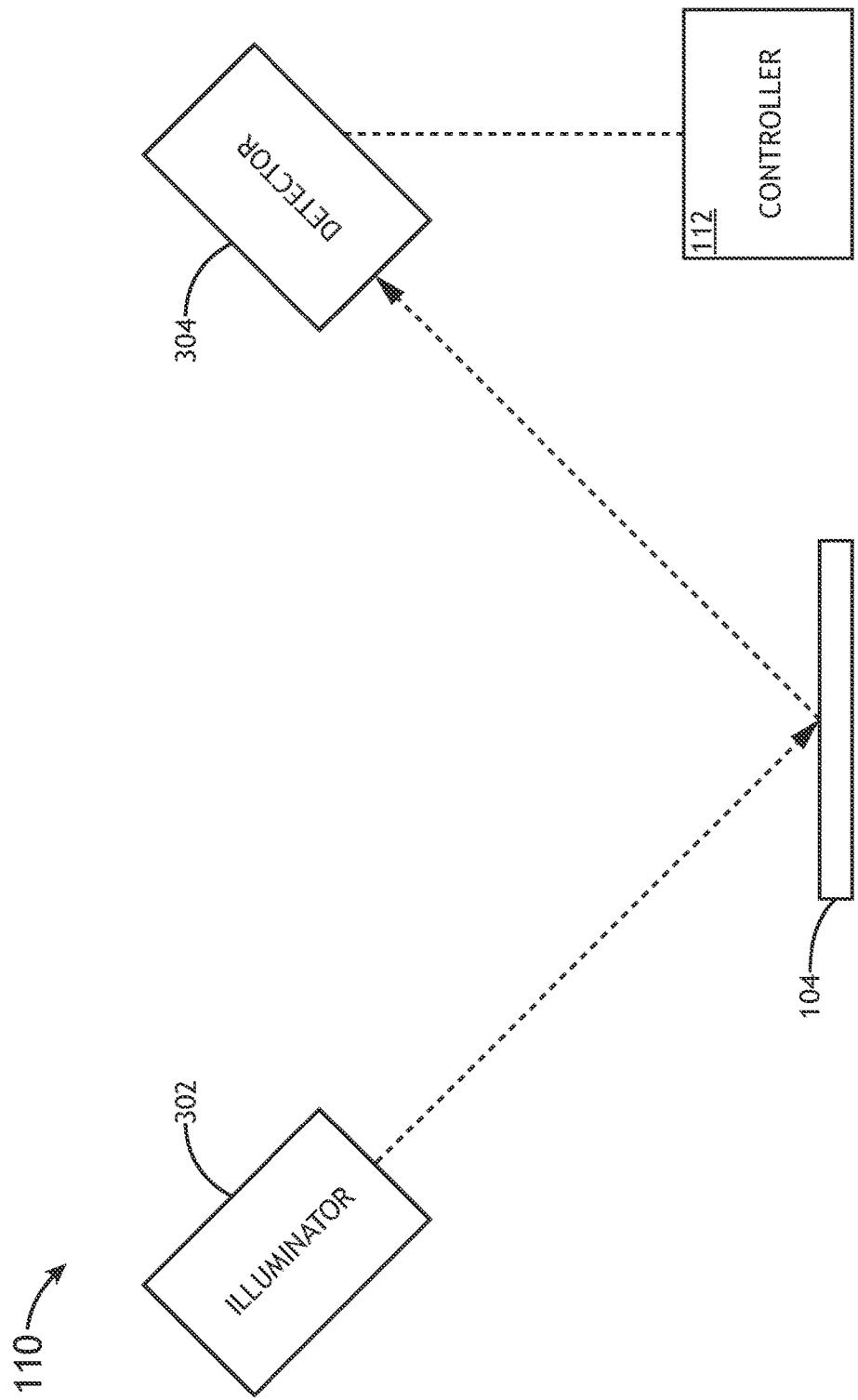
FIG. 3 illustrates a simplified schematic view of a reflection-mode characterization tool of a system for process-induced displacement characterization during semiconductor production, in accordance with one or more embodiments of the present disclosure.

FIGS. 1-3 generally illustrate a system for process-induced displacement characterization during semiconductor production, in accordance with one or more embodiments of the present disclosure.

FIG. 1 illustrates a simplified block diagram of a system 100 for process-induced displacement characterization during semiconductor production, in accordance with one or more embodiments of the present disclosure.

In one embodiment, the system 100 is configured to perform a semiconductor production process. In another embodiment, the semiconductor production process includes one or more semiconductor fabrication processes. For example, the one or more semiconductor fabrication processes may include, but are not limited to, one or more lithographic processes such as substrate preparation, spin coating, pre-bake processes, exposure processes, post-exposure baking processes, development processes, post-bake processes, or the like. For instance, the one or more lithographic processes may include, but are not limited to, patterning processes, etching processes, stripping processes, annealing processes, chemical mechanical planarization (CMP) processes, or the like. By way of another example, the one or more semiconductor fabrication processes may include, but are not limited to, one or more film deposition processes. For example, the one or more film deposition processes may include, but are not limited to, chemical vapor deposition (CVD) processes, physical vapor deposition (PVD) processes, or the like.

In another embodiment, the semiconductor production process includes one or more semiconductor characterization processes. For example, the one or more semiconductor characterization processes may be performed before, between, and/or following the one or more semiconductor production processes.

In another embodiment, the system 100 includes one or more process tools 102 configured to perform the one or more semiconductor fabrication processes. In another embodiment, the one or more process tools 102 include one or more lithography process tools. For instance, the one or more lithography process tools may include, but are not limited to, patterning tools, etching tools, semiconductor doping tools, or the like. Generally, the one or more lithography process tools may include any lithography process tool known in the art. Accordingly, the description of the one or more lithography process tools is not intended to limit the present disclosure in any way, and the above description should not be interpreted as a limitation on the scope of the present disclosure but merely an illustration.

In another embodiment, the one or more process tools 102 include one or more film deposition tools. For example, the one or more film deposition tools may deposit one or more films to form one or more layers on a sample 104. For instance, a layer may include one or more films fabricated by a set of semiconductor production processes that begins with the patterning of an intended design and ends immediately before the patterning of the next design for the next layer. In another embodiment, the one or more films are deposited based on an operating recipe. For example, the one or more films may be deposited on a front side of the sample 104 (e.g., frontside film), a back side of the sample 104 (e.g., a backside film), and/or on a layer previously deposited on the sample 104.

In another embodiment, the sample 104 includes any sample suitable for characterization (e.g., review, imaging overlay, or the like). For example, the sample 104 may include, but is not limited to, a photomask/reticle, semiconductor wafer, or the like. As used through the present disclosure, the term "wafer" refers to a substrate formed of a semiconductor and/or a non-semiconductor material. For instance, in the case of a semiconductor material, the wafer may be formed from, but is not limited to, monocrystalline silicon, gallium arsenide, and/or indium phosphide. As such, the term "wafer" and the term "sample" may be used interchangeably in the present disclosure. Therefore, the above description should not be interpreted as a limitation on the scope of the present disclosure but merely an illustration.

It is noted herein that many different types of devices may be formed on a wafer, and the term wafer as used herein is intended to encompass a wafer on which any type of device known in the art is being fabricated. Therefore, the above description should not be interpreted as a limitation on the scope of the present disclosure but merely an illustration.

In another embodiment, the sample 104 is secured via a sample stage. The sample stage may include any appropriate mechanical and/or robotic assembly known in the art of semiconductor characterization. For example, the sample stage may be configured to secure the sample 104 via contact with at least a portion of a frontside surface and/or a backside surface of the sample 104. For instance, the sample stage may include, but is not limited to, a platform. By way of another example, the sample stage may be configured to secure the sample 104 via contact with a thickness surface and/or an edge of the sample 104. For instance, the sample stage may include, but is not limited to, one or more point contact devices.

The sample stage may include an actuatable stage. For example, the sample stage may include, but is not limited to, one or more translational stages suitable for selectively translating the sample 104 along one or more linear directions (e.g., x-direction, y-direction, and/or z-direction). By way of another example, the sample stage may include, but is not limited to, one or more rotational stages suitable for selectively rotating the sample 104 along a rotational direction. By way of another example, the sample stage may include, but is not limited to, one or more rotational stages and translational stages suitable for selectively translating the sample 104 along a linear direction and/or rotating the sample 104 along a rotational direction. By way of another example, the sample stage may be configured to translate or rotate the sample 104 for positioning, focusing, and/or scanning in accordance with a selected characterization process (e.g., review, imaging overlay, or the like), several of which are known to the art.

In another embodiment, the system 100 includes a characterization sub-system 106 configured to perform the one or more semiconductor characterization processes. For example, the characterization sub-system 106 may include, but are not limited to, one or more interferometer tools 108. By way of another example, the characterization sub-system 106 may include, but are not limited to, one or more reflection-mode characterization tools 110.

In another embodiment, the one or more interferometer tools 108 and the one or more reflection-mode characterization tools 110 are integrated components of the characterization sub-system 106. In this regard, the metrology cycle time may be parallelized and subsequently reduced. It is noted herein, however, that the one or more interferometer tools 108 and the one or more reflection-mode characterization tools 110 may be stand-alone components within the characterization sub-system 106.

Generally, the characterization sub-system 106 may include any review tool, imaging-based overlay metrology tool, or similar tool known in the art. For example, the system 100 may include, but is not limited to, an optical characterization sub-system. For instance, the optical characterization sub-system may include an optical characterization sub-system capable of generating one or more high-resolution images representing the electrical intent of the sample 104 and capable of operating at a wavelength corresponding to, but not limited to, visible light, UV radiation, DUV radiation, VUV radiation, EUV radiation, and/or X-ray radiation. In addition, the optical characterization sub-system may include a broadband inspection sub-system including, but not limited to, a laser sustained plasma (LSP) based inspection sub-system. Further, the optical characterization sub-system may include a narrowband characterization sub-system, such as, but not limited to, a laser scanning inspection sub-system. Further, the optical characterization sub-system may include, but is not limited to, a brightfield imaging tool, or a darkfield imaging tool. It is noted herein that the system 100 may include any optical system configured to collect and analyze illumination reflected, scattered, diffracted, and/or radiated from a surface of the sample 104. In a general sense, although not shown here, the system 100 may include any characterization system suitable for inspecting one or more wafers, reticles, or photomasks. Accordingly, the description of the characterization sub-system 106 (e.g., the one or more interferometer tools 108 and/or the one or more reflection-mode characterization tools 110) throughout the present disclosure is not intended to limit the present disclosure in any way, and the above description should not be interpreted as a limitation on the scope of the present disclosure but merely an illustration.

In another embodiment, the sample 104 is transferred between the one or more process tools 102 and the characterization sub-system 106 during the semiconductor production process. For example, the characterization sub-system 106 may perform the one or more semiconductor characterization processes before, between, and/or following the one or more semiconductor fabrication processes. For instance, film force/stress induced by bending and/or warping of the sample 104 due to a stress imbalance between the front side and the back side of the sample 104 may be determined via the one or more semiconductor characterization processes. In addition, in-plane displacement may be determined from the induced film force/stress. Further, overlay error may be determined via the one or more semiconductor characterization processes.

In another embodiment, the film force/stress, the in-plane displacement, and/or the overlay error may be compensated for in subsequent fabrication processes on subsequent samples 104 and/or compensated for in subsequent fabrication processes on the same sample 104 (e.g., in the feed forward loop or the feedback loop). For example, the operating recipe, the one or more process tools 102, and/or the characterization sub-system 106 may be adjustable in a feed forward or a feedback loop based on the film force/stress, the in-plane displacement, and/or the overlay error.

Although embodiments of the present disclosure describe the one or more process tools 102 and the characterization sub-system 106 as components of the system 100, it is noted herein that the one or more process tools 102 and/or the characterization sub-system 106 may not be integral or required components of the system 100. Therefore, the above description should not be interpreted as a limitation on the scope of the present disclosure but merely an illustration.

In one embodiment, the system 100 includes a controller 112. For example, the controller 112 may be communicatively coupled to the one or more process tools 102 (e.g., the one or more lithographic process tools and/or the one or more film deposition tools). By way of another example, the controller 112 may be communicatively coupled to one or more tools of the characterization sub-system 106 (e.g., the one or more interferometer tools 108 or the one or more reflection-mode characterization tools 110).

In another embodiment, the controller 112 includes one or more processors 114 and memory 116. In another embodiment, the memory 116 stores one or more set of program instructions 118. In another embodiment, the one or more sets of program instructions 118 are configured to cause the one or more processors 114 to carry out any of the one or more processes described throughout the present disclosure. In another embodiment, a user interface 120 is communicatively coupled to and/or integrated with the controller 112.

The controller 112 may be configured to receive and/or acquire data or information from other systems or sub-systems (e.g., the one or more process tools 102, the characterization sub-system 106, the user interface 120, or the like) of the system 100 via a transmission medium that may include wireline and/or wireless portions. The controller 112 may in addition be configured to transmit data or information (e.g., the output of one or more procedures of the inventive concepts disclosed herein) to one or more systems or sub-systems (e.g., the one or more process tools 102, the characterization sub-system 106, the user interface 120, or the like) of the system 100 by a transmission medium that may include wireline and/or wireless portions. In this regard, the transmission medium may serve as a data link between the controller 112 and the other subsystems of the system 100. In addition, the controller 112 may be configured to send data to external systems via a transmission medium (e.g., network connection).

The one or more processors 114 may include any one or more processing elements known in the art. In this sense, the one or more processors 114 may include any microprocessor device configured to execute algorithms and/or program instructions 118. For example, the one or more processors 114 may consist of a desktop computer, mainframe computer system, workstation, image computer, parallel processor, handheld computer (e.g., tablet, smartphone, or phablet), or another computer system (e.g., networked computer). In general, the term "processor" may be broadly defined to encompass any device having one or more processing elements, which execute the one or sets of program instructions 118 from a non-transitory memory medium (e.g., the memory 116). Moreover, different subsystems of the system 100 (e.g., the one or more process tools 102, the characterization sub-system 106, the user interface 120, or the like) may include processor or logic elements suitable for carrying out at least a portion of the steps described throughout the present disclosure. Therefore, the above description should not be interpreted as a limitation on the present disclosure but merely an illustration.

The memory 116 may include any storage medium known in the art suitable for storing the one or more sets of program instructions 118 executable by the associated one or more processors 114. For example, the memory 116 may include a non-transitory memory medium. For instance, the memory 116 may include, but is not limited to, a read-only memory, a random access memory, a magnetic or optical memory device (e.g., disk), a magnetic tape, a solid state drive, and the like. The memory 116 may be configured to provide display information to a display device of the user interface 120. The memory 116 may in addition be configured to store user input information from a user input device of the user interface 120. The memory 116 may be housed in a common controller 112 housing with the one or more processors 114. The memory 116 may, alternatively or in addition, be located remotely with respect to the spatial location of the processors 114 and/or the controller 112. For instance, the one or more processors 114 and/or the controller 112 may access a remote memory 116 (e.g., server), accessible through a network (e.g., internet, intranet, and the like).

In another embodiment, the controller 112 executes one or more semiconductor fabrication processes, one or more semiconductor characterization processes, one or more modelling processes, and/or one or more system analysis processes from program instructions 118 stored on memory 116 via the one or more processors 114. For example, the one or more semiconductor characterization processes may determine film force/stress and/or the in-plane displacements of the sample 104. By way of another example, the one or more modelling processes may determine one or more spatial characteristics of the sample 104 and/or overlay error based on the film force/stress and/or the in-plane displacements. By way of another example, the one or more system analysis processes may alert one or more components of the system 100 (e.g., the one or more process tools 102, the characterization sub-system 106, and/or the controller 112) about the presence of a new backside film and/or the modification of an existing backside film. For instance, the alert may trigger one or more additional fabrication processes, characterization processes, and/or modelling processes by the one or more components of the system 100 (e.g., the one or more process tools 102, the characterization sub-system 106, and/or the controller 112) in a feed forward or feedback loop.

Although embodiments of the present disclosure illustrate the controller 112 as a stand-alone component from the one or more process tools 102 and/or from the characterization sub-system 106, it is noted herein that any fabrication processes, characterization processes, modelling processes, and/or system analysis processes for determining spatial characteristics of samples 104 may be implemented via a controller integrated within the one or more process tools 102 and/or within one or more tools of the characterization sub-system 106. Therefore, the above description should not be interpreted as a limitation on the scope of the present disclosure but merely an illustration.

In another embodiment, the controller 112 is coupled to a user interface 120. In another embodiment, the user interface 120 includes the display. In another embodiment, the user interface 120 includes the user input device. In another embodiment, the display device is coupled to the user input device. For example, the display device may be coupled to the user input device by a transmission medium that may include wireline and/or wireless portions.

The display device may include any display device known in the art. For example, the display device may include, but is not limited to, a liquid crystal display (LCD). By way of another example, the display device may include, but is not limited to, an organic light-emitting diode (OLED) based display. By way of another example, the display device may include, but is not limited to a CRT display. Those skilled in the art should recognize that a variety of display devices may be suitable for implementation in the present invention and the particular choice of display device may depend on a variety of factors, including, but not limited to, form factor, cost, and the like. In a general sense, any display device capable of integration with a user input device (e.g., touchscreen, bezel mounted interface, keyboard, mouse, trackpad, and the like) is suitable for implementation in the present invention.

The user input device may include any user input device known in the art. For example, the user input device may include, but is not limited to, a keyboard, a keypad, a touchscreen, a lever, a knob, a scroll wheel, a track ball, a switch, a dial, a sliding bar, a scroll bar, a slide, a handle, a touch pad, a paddle, a steering wheel, a joystick, a bezel input device, or the like. In the case of a touchscreen interface, those skilled in the art should recognize that a large number of touchscreen interfaces may be suitable for implementation in the present invention. For instance, the display device may be integrated with a touchscreen interface, such as, but not limited to, a capacitive touchscreen, a resistive touchscreen, a surface acoustic based touchscreen, an infrared based touchscreen, or the like. In a general sense, any touchscreen interface capable of integration with the display portion of a display device is suitable for implementation in the present invention. In another embodiment, the user input device may include, but is not limited to, a bezel mounted interface.

Although embodiments of the present disclosure describe the controller 112 as a component of the system 100, it is noted herein that the controller 112 may not be an integral or required component of the system 100. In addition, while embodiments of the present disclosure describe the user interface 120 as a component of the system 100, it is noted herein that the user interface 120 may not be an integral or required component of the system 100. Therefore, the above description should not be interpreted as a limitation on the scope of the present disclosure but merely an illustration.

FIGS. 2A-2C generally illustrate an interferometer tool 108 of the system 100 for process-induced displacement characterization during semiconductor production, in accordance with one or more embodiments of the present disclosure.

The interferometer tool 108 may be configured to measure one or more spatial characteristics of the sample 104 that represent the wafer geometry (WG) or patterned wafer geometry (PWG) of the sample 104. For instance, the one or more spatial characteristics may include, but are not limited to, frontside height, backside height, thickness variation, flatness, and derivatives such as shape, shape-difference, nanotopography, or the like. It is noted herein the one or more spatial characteristics of the sample 104 may be related to the wafer geometry of the sample 104. In addition, it is noted herein that the interferometer tool 108 may be adapted to characterize patterned wafer geometry on the sample 104, whereby the dynamic range of the sample 104 slope (e.g., wafer slope) measured by the interferometer tool 108 is extended by stitching measurement results of different regions of the sample 104 together.

In another embodiment, the one or more spatial characteristics of the sample 104 that represent the wafer geometry or patterned wafer geometry of the sample 104 include in-plane displacements (IPD). In another embodiment, the IPD includes displacements generated by film force/stress and/or wafer shape, where the change in film force is generated during one or more fabrication processes (e.g., lithography processes, frontside film processes, backside film processes, or the like).

The interferometer tool 108 may include any interferometer tool known in the art. Generally, it is noted herein that the present disclosure may be extended to any phase-shifting interferometry system configured to utilize a wavelength-tunable illumination source for phase shifting. Therefore, the above description should not be interpreted as a limitation on the scope of the present disclosure but merely an illustration.

Referring now to FIG. 2A, the interferometer tool 108 is disclosed, in accordance with one or more embodiments of the present disclosure. In one embodiment, the interferometer tool 108 includes a dual wavelength dual interferometer. For example, the dual wavelength dual interferometer may include, but is not limited to, a dual wavelength dual Fizeau interferometer (DWDFI). In another embodiment, the interferometer tool 108 includes an interferometer 202a and an interferometer 202b.

Examples of a dual wavelength dual interferometer are described in U.S. Pat. No. 6,847,458, issued on Jan. 25, 2005; U.S. Pat. Pub. No. 2014/0293291, published on Oct. 2, 2014; U.S. Pat. No. 7,847,954, issued on Dec. 7, 2010; and U.S. Pat. No. 8,068,234, issued on Nov. 29, 2011, which is incorporated herein by reference in the entirety.

In another embodiment, the interferometer tool 108 includes one or more illumination sources, or illuminators, 204. The illuminators 204 may include any illumination source known in the art. For example, the illumination source may include, but is not limited to, a narrowband radiation source. For instance, the narrowband radiation source may include, but is not limited to, a laser.

In another embodiment, the one or more illuminators 204 generate and direct radiation (e.g., a beam of illumination) via a first radiation channel or an additional radiation channel to a polarizing beam splitter 210a or 210b of the interferometer 202a or 202b, where the first radiation channel or the additional radiation channel includes an optical fiber 206a or 206b and an interferometer input 208a or 208b. In another embodiment, the polarizing beam splitters 210a, 210b direct a portion of received radiation to a quarter-wave plate 212a or 212b. For example, radiation passing through the polarizing beam splitters 210a, 210b and through the quarter-wave plates 212a, 212b may be circularly polarized. In another embodiment, the radiation is directed by the quarter-wave plates 212a, 212b through a lens 214a or 214b. For example, the lenses 214a, 214b may be configured to collimate the radiation into beams having a diameter greater than a diameter of the sample 104. In another embodiment, the radiation is directed by the lenses 214a, 214b through a reference flat 216a or 216b. For example, the reference flats 216a, 216b may be substantially parallel. In another embodiment, the reference flats 216a, 216b include a surface 218a or 218b.

It is noted herein the interferometers 202a, 202b may include one or more additional optical elements including any optical element known in the art suitable for focusing, suppressing, filtering, extracting, and/or directing the radiation generated by the illuminator 204 towards the sample 104.

In another embodiment, the sample 104 is positioned within a cavity 220 defined by the surfaces 218a, 218b. In another embodiment, a portion of the radiation is transmitted through the reference flats 216a, 216b and directed onto a surface 222a or 222b of the sample 104. In another embodiment, a portion of the radiation is transmitted through the reference flats 216a, 216b and directed onto the reference flat 216a, 216b located opposite of the transmitting reference flat 216a, 216b.

Referring now to FIGS. 2B and 2C, the cavity 220 of the interferometer tool 108 is illustrated, in accordance with one or more embodiments of the present disclosure.

In one embodiment, the cavity 220 includes one or more point contact devices to hold the sample 104 between the surfaces 218a, 218b of the reference flats 216a, 216b. In another embodiment, the interferometer tool 108 utilizes the reference flats 216a, 216b as the reference surfaces for the interferometers 202a, 202b to analyze one or more parameters associated with the sample 104 and its spatial relationship to the reference flats 216a, 216b.

In another embodiment, as illustrated in FIG. 2B, the one or more point contact devices hold the sample 104 in a substantially vertical position within the cavity 220 between the surfaces 218a, 218b of the reference flats 216a, 216b. In this regard, plane warping of the sample 104 may be apparent while one or more measurements are obtained of the sample 104, as opposed to when the sample 104 is chucked in a substantially horizontal position (which may serve to reduce, remove, and/or negate the warp).

In another embodiment, as illustrated in FIG. 2C, the one or more point contact devices hold the sample 104 in a substantially horizontal position within the cavity 220 between the surfaces 218a, 218b of the reference flats 216a, 216b. In another embodiment, the sample 104 experiences gravitational sag if held in a substantially horizontal position. For example, a bare sample 104 may experience gravitational sag that is measurable when held in a substantially horizontal position rather than a substantially vertical position. It is noted herein, however, that the contribution of the gravitational sag to the deposition and/or fabrication error may be much smaller than the contribution of the warping caused by the film force/stress of a deposited layer on the sample 104. In this regard, the errors measured on the sample 104 including one or more deposited layers may not be substantially affected by the orientation of the sample 104 within the cavity 220.

Although embodiments of FIG. 2A are directed to the vertical cavity 220 as illustrated in FIG. 2B, it is noted herein that the interferometer tool 108 may include one or more additional optics necessary to form the substantially horizontal cavity 220 in FIG. 2C. Therefore, the above description should not be interpreted as a limitation on the scope of the present disclosure but merely an illustration.

Referring again to FIG. 2A, in one embodiment the interferometer tool 108 detects one or more defects on the surfaces 222a, 222b of the sample 104. For purposes of the present disclosure, a defect may be classified as a void, short, particle, residue, scum, overlay error, in-plane displacement/distortion (IPD), out-of-plane displacement/distortion (OPD), or any other defect known in the art.

In another embodiment, the interferometer tool 108 detects one or more defects on the sample 104 via a detector 226a or 226b. The detectors 226a, 226b may include any detector known in the art. For example, the detectors 226a, 226b may include, but are not limited to, one or more photo-multiplier tubes (PMTs), one or more charge coupled devices (CCDs), one or more time-delay integration (TDI) cameras, or the like.

In another embodiment, the sample 104 reflects, scatters, and/or diffracts radiation (e.g., a beam of illumination) from the one or more illuminators 204. In another embodiment, the detectors 226a, 226b detect portions of the radiation reflected, scattered, and/or diffracted (e.g., acquired) from corresponding surfaces 222a, 222b of the sample 104 in response to the radiation directed by the reference flats 216a, 216b. In another embodiment, the detectors 226a, 226b detect portions of radiation transmitted through corresponding surfaces 218a, 218b of reference flats 216a, 216b in response to the collimated beams directed from the reference flats 216a, 216b located opposite the transmitting reference flats 216a, 216b.

In another embodiment, the radiation reflected from the surfaces 222a, 222b of the sample 104 and/or the radiation transmitted through corresponding surfaces 218a, 218b of reference flats 216a, 216b is directed to the detectors 226a, 226b via a lens 224a or 224b. For example, the lenses 224a, 224b may be positioned between the lenses 214a, 214b and the detectors 226a, 226b at a distance from the lenses 214a, 214b either greater than, less than, or equal to the focal length of the lenses 214a, 214b.

It is noted herein the interferometers 202a, 202b may include one or more additional optical elements including any optical element known in the art suitable for focusing, suppressing, filtering, extracting, and/or directing the radiation generated by the illuminator 204 towards the detectors 226a, 226b. Therefore, the above description should not be interpreted as a limitation on the scope of the present disclosure but merely an illustration.

FIG. 3 illustrates a reflection-mode characterization tool 110 of the system 100 for process-induced displacement characterization during semiconductor production, in accordance with one or more embodiments of the present disclosure.

In one embodiment, the reflection-mode characterization tool 110 is configured to measure film properties (TNK) of the sample 104. For example, the film properties may include thickness (T), the real component of the index of refraction (n), and the complex component of the index of refraction (k) of the film or film stack. In another embodiment, the reflection-mode characterization tool 110 is configured to measure intensity spectra (IS) of the sample 104. The intensity spectra may include intensity variation in reflected radiation over a broad spectrum of wavelengths across a film or the sample 104.

In another embodiment, the reflection-mode characterization tool 110 includes one or more illumination sources 302. In another embodiment, the reflection-mode characterization tool 110 includes one or more detectors 304. In another embodiment, the sample 104 reflects, scatters, and/or diffracts radiation (e.g., a beam of illumination) impinging on the sample 104 from the one or more illumination sources 302. In another embodiment, the one or more detectors 304 detect portions of the radiation acquired from the sample 104.

In another embodiment, the reflection-mode characterization tool 110 includes one or more sets of optics. For example, the one or more sets of optics may include any optical element known in the art suitable for focusing, suppressing, filtering, extracting, and/or directing the radiation generated by the illuminator 302 towards the surface of the sample 104. By way of another example, the one or more sets of optics may include any optical element known in the art suitable for focusing, suppressing, filtering, extracting, and/or directing the portions of the radiation acquired by the surface of sample 104 to the detectors 304.

In another embodiment, the reflection-mode characterization tool 110 includes one or more polarizers. For example, radiation may pass through the polarizers prior to illuminating the sample 104. By way of another example, the portions of the radiation acquired by the sample 104 may pass through the polarizers prior to reaching the detectors 304.

The one or more illumination sources 302 may include any illumination source known in the art. For example, the one or more illumination sources 302 may include, but are not limited to, one or more broadband illumination sources or one or more narrowband sources.

Generally, the reflection-mode characterization tool 110 may include any film and/or wafer characterization tool known in the art. For example, the reflection-mode characterization tool 110 may include, but is not limited to, a spectroscopic ellipsometer, a reflectometer, or the like. Examples of a reflection-mode characterization tool 110 are described in U.S. Pat. No. 5,805,278, issued Sep. 9, 1998; U.S. Pat. No. 6,621,570, issued Sep. 16, 2003; U.S. Pat. No. 7,092,082, issued Aug. 8, 2006; U.S. patent application Ser. No. 14/459,155, filed Aug. 13, 2014; U.S. patent application Ser. No. 14/667,235, filed on Mar. 24, 2015; U.S. patent application Ser. No. 15/667,401, filed Aug. 2, 2017; and U.S. patent application Ser. No. 15/727,212, filed Oct. 6, 2017, which are incorporated herein by reference in the entirety. An example of a reflection-mode characterization tool 110 is described in U.S. patent application Ser. No. 16/018,355, filed Jun. 26, 2018, which is incorporated herein by reference in the entirety.

In another embodiment, measurements obtained via the detectors 304 include intensity variation in the portions of the radiation acquired from the sample 104. In another embodiment, the measurements are fitted and/or compared to reference data. For example, the reference data may be modelled, simulated, and/or experimentally obtained.

FIGS. 4A-11B generally illustrate process-induced displacement characterization during semiconductor production processes, in accordance with one or more embodiments of the present disclosure.

In one embodiment, a layer is formed on the sample 104 via a semiconductor production process (e.g., any of semiconductor production processes 400, 420, 500, 510, 700, 710, 900, 1000, 1100, 1110). While embodiments of the present disclosure generally focus on the semiconductor production process 400, it is noted herein that any description of the semiconductor production process 400 may be extended to the semiconductor production processes 420, 500, 510, 700, 710, 900, 1000, 1100, 1110 for purposes of the present disclosure. Therefore, the above description should not be interpreted as a limitation on the scope of the present disclosure but merely an illustration.

In another embodiment, the semiconductor production process 400 includes one or more lithography processes 402. For example, the semiconductor production process 400 may include, but is not limited to, two lithography processes 402.

In another embodiment, the semiconductor production process 400 includes one or more frontside film processes 404. For example, the semiconductor production process 400 may include up to an N number of frontside film processes 404. In another embodiment, the semiconductor production process 400 includes one or more backside film processes 406. For example, the semiconductor production process 400 may include up to an N number of backside film processes 406.

In another embodiment, the semiconductor production process 400 includes one or more sets of frontside film processes 404. For example, the semiconductor production process 400 may include up to an N number of sets of frontside film processes 404. In another embodiment, the semiconductor production process 400 includes one or more sets of backside film processes 406. For example, the semiconductor production process 400 may include up to an N number of sets of backside film processes 406.

In another embodiment, the semiconductor production process 400 includes one or more sets of backside film processes 406 between two or more sets of frontside film processes 404. It is noted herein, however, that the semiconductor production process 400 may include one or more sets of frontside film processes 404 between two or more sets of backside film processes 406. Therefore, the above description should not be interpreted as a limitation on the scope of the present disclosure but merely an illustration.

In another embodiment, the one or more film deposition processes includes one or more discrete backside film processes 406 that are processed (e.g., deposited, etched, or the like) independently from the one or more frontside film processes 404 and categorized based on the estimation of film force/stress and resultant IPD. It is noted herein the one or more discrete backside film processes 406 may be intentionally processed for the purpose of stress engineering, warp control, or other semiconductor testing, semiconductor measuring, or semiconductor adjusting uses.

In one embodiment, the semiconductor production process 400 includes one or more semiconductor characterization processes. In another embodiment, the semiconductor characterization processes include a set of one or more semiconductor characterization processes that monitor and control the film force/stress-induced in-plane displacements. For example, the semiconductor characterization processes may measure changes in wafer geometry (WG)/patterned wafer geometry (PWG); film properties (TNK) including thickness (t), the real component of the index of refraction (n), and the complex component of the index of refraction (k); and/or intensity spectra (IS).

In another embodiment, a first characterization process is performed at the beginning of layer production, prior to the first lithography process 402. In another embodiment, an additional characterization process is performed at the end of layer production, prior to the additional lithography process 402.

In another embodiment, where the semiconductor production process 400 includes one or more intermediate film deposition processes (e.g. the one or more backside film processes 406 and/or the one or more frontside film processes 404), the semiconductor production process includes a set of one or more semiconductor characterization processes to determine the changes in film force/stress induced by the one or more film deposition processes.

The total change in shape (w) induced within the layer by a particular process being monitored and/or controlled is illustrated in EQ. 1. One example of the use of EQ. 1, where the semiconductor production process 400 includes three film deposition processes, is illustrated in EQ. 2.

$$w = w_{2-1} + w_{3-2} + \ldots + w_{n-(n-1)} = w_{n-1} \qquad \text{EQ.1}$$

$$w = w_{2-1} + w_{3-2} + w_{4-3} = w_{n-1} \qquad \text{EQ. 2}$$

Estimating IPD induced by the one or more frontside film processes 404 in the presence of axisymmetric stress fields is illustrated in EQ. 3. Estimating IPD induced by the one or more backside film processes 406 in the presence of axisymmetric stress fields is illustrated EQ. 4. In EQS. 3 and 4, h is the nominal thickness of the sample 104.

$$IPD_{FrontFilm} = -(h/6)\frac{\partial w}{\partial x} \qquad \text{EQ. 3}$$

$$IPD_{BackFilm} = +(h/6)\frac{\partial w}{\partial x} \qquad \text{EQ. 4}$$

The cumulative effect of the series of film processes including both the one or more frontside film processes 404 and the one or more backside film processes 406 may be determined via superposition. The application of EQS. 3 and 4 to EQ. 2, where the three film deposition processes are further defined to include a backside film process 406 between two frontside film processes 404, is illustrated in EQ. 5, which may be rearranged as illustrated in EQ. 6.

$$IPD_{Tot} = IPD_{2-1} - IPD_{3-2} + IPD_{4-3} \qquad \text{EQ. 5}$$

$$IPD_{Tot} = IPD_{4-1} - 2*IPD_{3-2} \qquad \text{EQ. 6}$$

It is noted herein that EQ.6, although derived for a simple axisymmetric case, is similarly suitable for advanced models including, but not limited to, Advanced-IPD, finite-element models (FEM), or the like.

In another embodiment, the semiconductor production process includes one or more overlay error processes 408. For example, the one or more overlay error processes 408 may determine overlay error by applying plate theory to wafer geometry characterization measurements. By way of another example, the one or more overlay error processes 408 may follow the one or more lithography processes 402, the one or more frontside film processes 404, and/or the one or more backside film processes 406.

In another embodiment, one or more of the operating recipe, the one or more process tools 102, and/or one or more tools of the characterization sub-system 106 are adjustable via a feed forward or a feedback loop based on the film force/stress, the in-place displacement, and/or the overlay error.

A description of the use of wafer geometry metrics and the application of plate theory for overlay error determination and semiconductor process control is found in K. T. Turner et al., *Predicting Displacements and Overlay Errors Due to Wafer Deformation During Chucking on Lithography Scanners*, Journal of Micro/Nanolithography, MEMS, and MOEMS (JM3), 8(4), p. 043015, 2010, which is incorporated herein by reference in the entirety. In addition, a description of the use of wafer geometry metrics and the application of plate theory for overlay error determination and semiconductor process control is found in T. A. Brunner et al., *Characterization of Wafer Geometry and Overlay Error on Silicon Wafers with Nonuniform Stress*, Journal of Micro/Nanolithography, MEMS, and MOEMS (JM3) 0001, 12(4):043002-043002, 2013, which is incorporated herein by reference in the entirety. Further, a description of the use of wafer geometry metrics and the application of plate theory for overlay error determination and semiconductor process control is found in D. Owen, *Stress Inspection for Overlay Characterization*, Proceedings of SPIE, Vol. 8681, p. 86812T, 2013, which is incorporated herein by reference in the entirety.

A description of methods to estimate the film-force and corresponding IPD induced by film processes is found in J. Gong et al., *Determining Local Residual Stresses from High Resolution Wafer Geometry Measurements*, Journal of Vacuum Science & Technology B (JVST B) 31, 050205, 2013, which is incorporated herein by reference in the entirety. In addition, a description of methods to estimate the film-force and corresponding IPD induced by film processes is found in U.S. Pat. No. 9,354,526, issued May 31, 2016, which is incorporated herein by reference in the entirety.

A description of methods to estimate the film-force and corresponding IPD induced by film processes via Advanced-IPD and/or FEM is found in K. T. Turner, et al., *Monitoring Process-Induced Overlay Errors Through High Resolution Wafer Geometry Measurements*, Proceedings of SPIE, Vol. 9050, p. 905013, 2014, which is incorporated herein by reference in the entirety. In addition, a description of methods to estimate the film-force and corresponding IPD induced by film processes via Advanced-IPD and/or FEM is found in T. A. Brunner et al., *Patterned wafer Geometry (PWG) Metrology for Improving Process-Induced Overlay and Focus Problems*, Proceedings of SPIE, Vol. 9780, p. 97800 W, 2016, which is incorporated herein by reference in the entirety.

Referring generally to FIGS. 4A-9, the semiconductor production processes includes one or more wafer geometry characterization processes. In one embodiment, a set of one or more wafer geometry characterization processes 410 is completed at the beginning of layer production, prior to a first lithography process 402. In another embodiment, a set of one or more wafer geometry characterization processes 412 is completed at the end of layer production, prior to an additional lithography process 402.

Figure 4A:
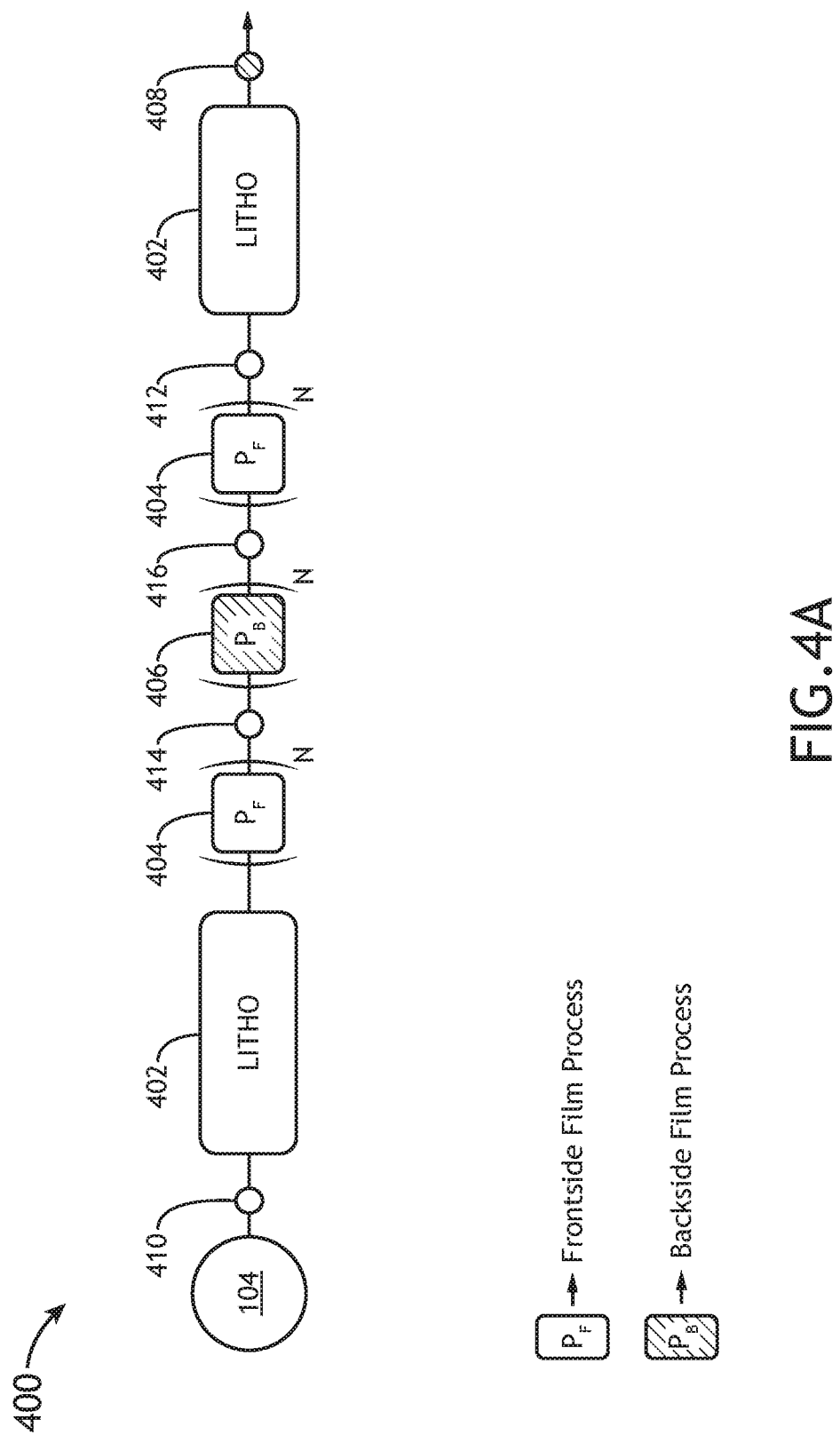
FIG. 4A illustrates a simplified block diagram of process-induced displacement characterization during semiconductor production, in accordance with one or more embodiments of the present disclosure.

Referring now to FIG. 4A, the semiconductor production process 400 includes one or more intermediate wafer geometry characterization processes. For example, the semiconductor production process 400 may be performed via the interferometer tool 108. In one embodiment, the semiconductor production process 400 includes a set of one or more wafer geometry characterization processes 414 prior to the one or more discrete backside film processes 406. In another embodiment, the semiconductor production process 400 includes a set of one or more wafer geometry characterization processes 416 following the one or more discrete backside film processes 406. In this regard, the one or more wafer geometry characterization processes 414, 416 may characterize the total effect the one or more discrete backside film processes 406 has on the film force/stress of the sample 104 in a single characterization process.

Figure 4B:
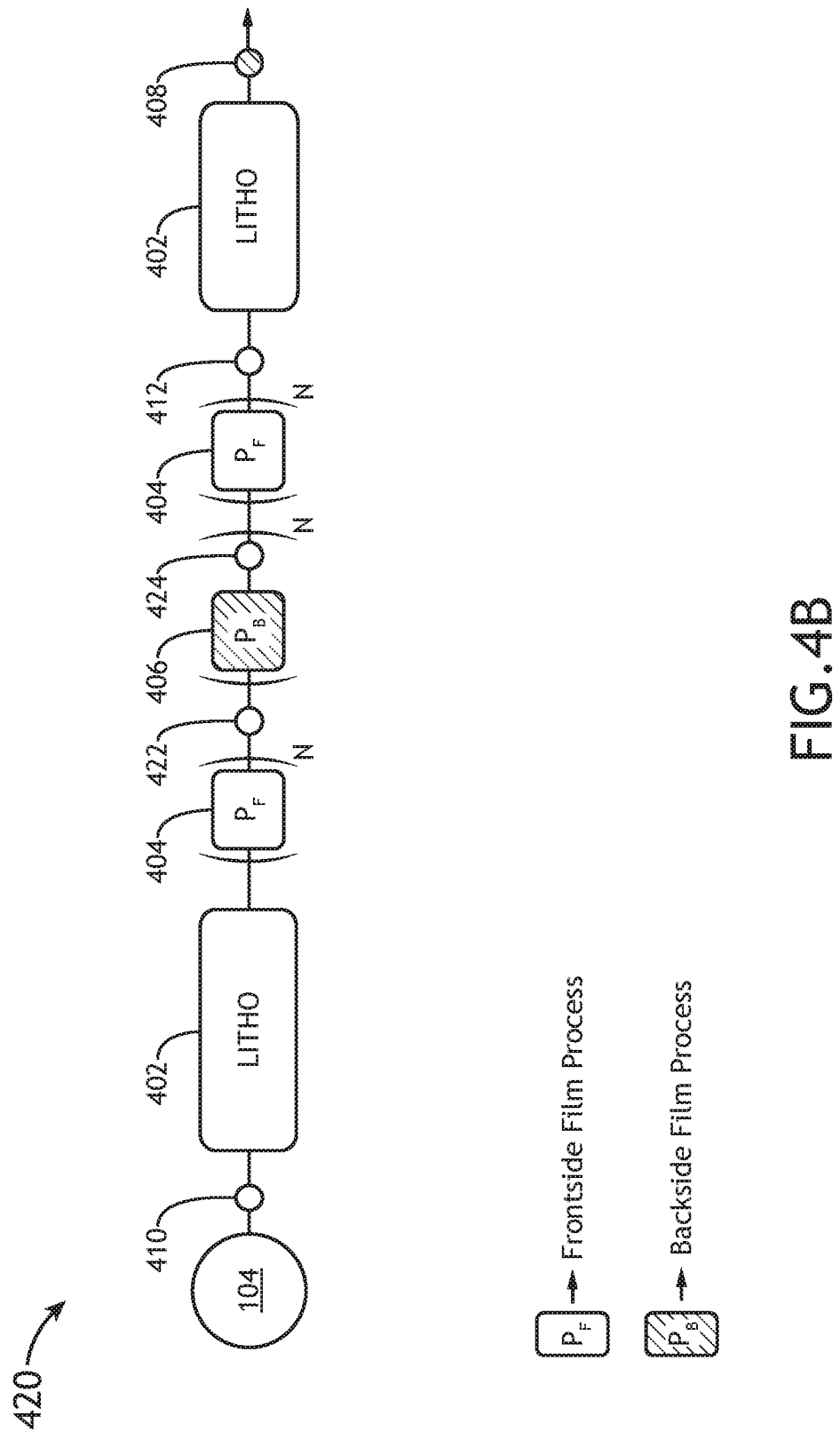
FIG. 4B illustrates a simplified block diagram of process-induced displacement characterization during semiconductor production, in accordance with one or more embodiments of the present disclosure.

Referring now to FIG. 4B, the semiconductor production process 420 includes one or more intermediate wafer geometry characterization processes. For example, the semiconductor production process 420 may be performed via the interferometer tool 108. In one embodiment, the semiconductor production process 420 includes a set of one or more wafer geometry characterization processes 422 prior to the one or more discrete backside film processes 406. In another embodiment, the semiconductor production process 420 includes a set of one or more wafer geometry characterization processes 424 following each discrete backside film process 406 of the one or more discrete backside film processes 406. In this regard, the one or more wafer geometry characterization processes 422, 424 may characterize the effect each discrete backside film process 406 of the one or more discrete backside film processes 406 separately has on the film force/film stress of the sample 104, at the expense of cycle time due to the increased number of wafer geometry characterization processes.

Figure 5A:
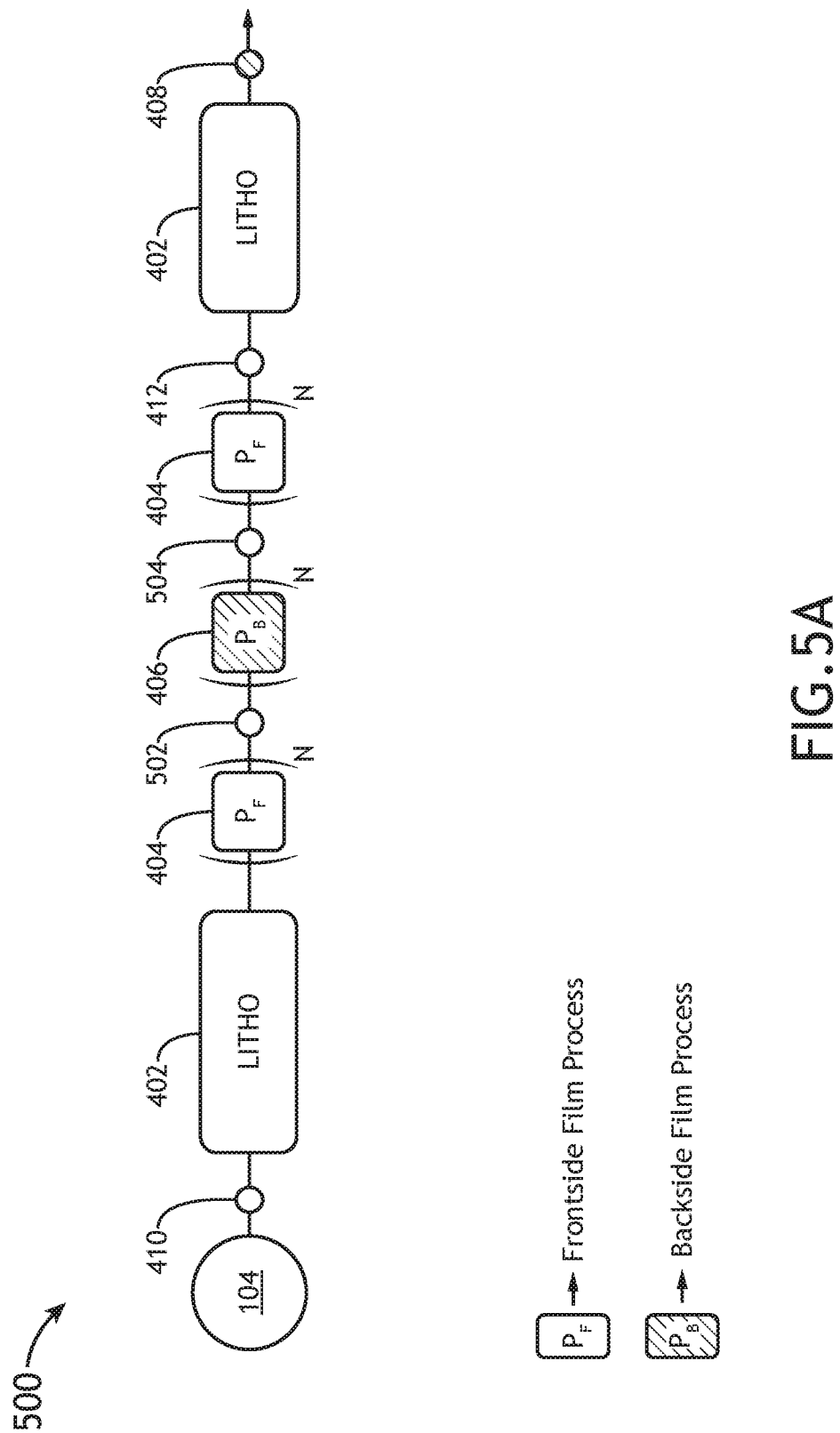
FIG. 5A illustrates a simplified block diagram of process-induced displacement characterization during semiconductor production, in accordance with one or more embodiments of the present disclosure.

Referring now to FIG. 5A, the semiconductor production process 500 includes one or more intermediate film properties (TNK) characterization processes in addition to the one or more wafer geometry characterization processes 410, 412. For example, the one or more wafer geometry characterization processes 410, 412 may be performed via the interferometer tool 108, while the one or more TNK characterization processes may be performed via the reflection-mode characterization tool 110. In one embodiment, the semiconductor production process 500 includes a set of one or more TNK characterization processes 502 prior to the one or more discrete backside film processes 406. In another embodiment, the semiconductor production process 500 includes a set of one or more TNK characterization processes 504 following the one or more discrete backside film processes 406. In this regard, the one or more TNK characterization processes 502, 504 may characterize the total effect the set of the one or more discrete backside film processes 406 has on the film force/stress of the sample 104 in a single TNK characterization process.

Figure 5B:
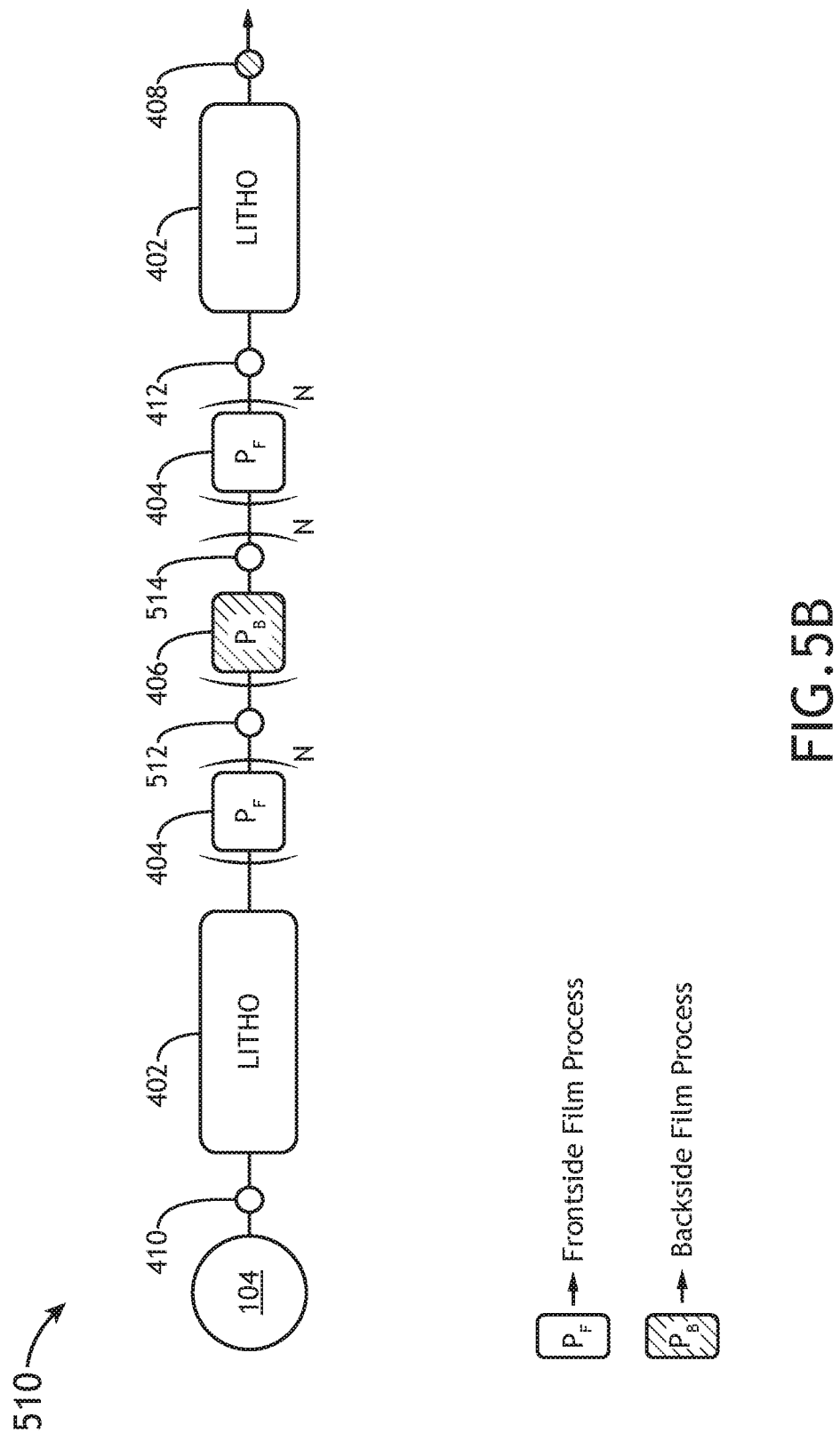
FIG. 5B illustrates a simplified block diagram of process-induced displacement characterization during semiconductor production, in accordance with one or more embodiments of the present disclosure.

Referring now to FIG. 5B, the semiconductor production process 510 includes one or more intermediate TNK characterization processes in addition to the one or more wafer geometry characterization processes 410, 412. For example, the one or more wafer geometry characterization processes 410, 412 may be performed via the interferometer tool 108, while the one or more TNK characterization processes may be performed via the reflection-mode characterization tool 110. In one embodiment, the semiconductor production process 510 includes a set of one or more TNK characterization processes 512 prior to the one or more discrete backside film processes 406. In another embodiment, the semiconductor production process 510 includes a set of one or more TNK characterization processes 514 following each discrete backside film process 406 of the one or more discrete backside film processes 406. In this regard, the one or more TNK characterization processes 512, 514 may characterize the effect each discrete backside film process of the one or more discrete backside film processes 406 separately has on the film force/stress of the sample 104, at the expense of cycle time due to the increased number of TNK characterization processes.

Figure 6A:
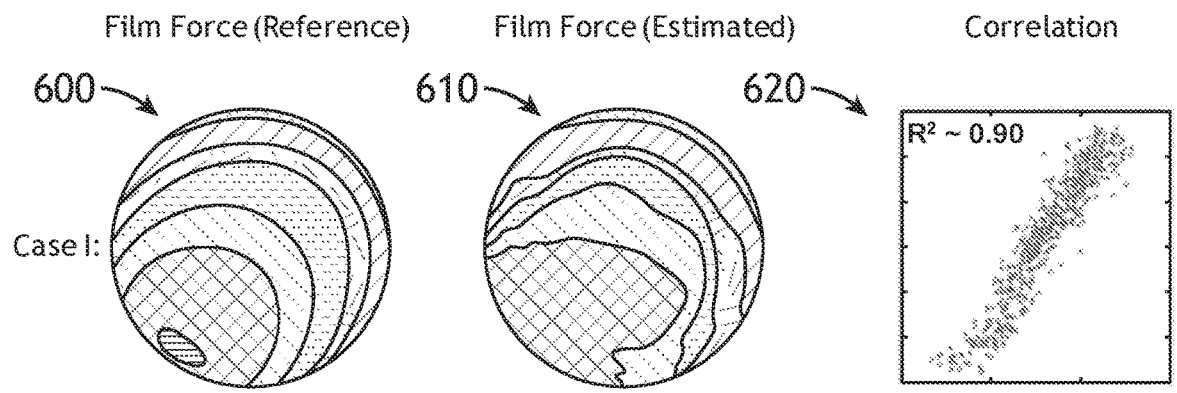
FIG. 6A illustrates a graph set of a test case for process-induced displacement characterization during semiconductor production, in accordance with one or more embodiments of the present disclosure.
Figure 6B:
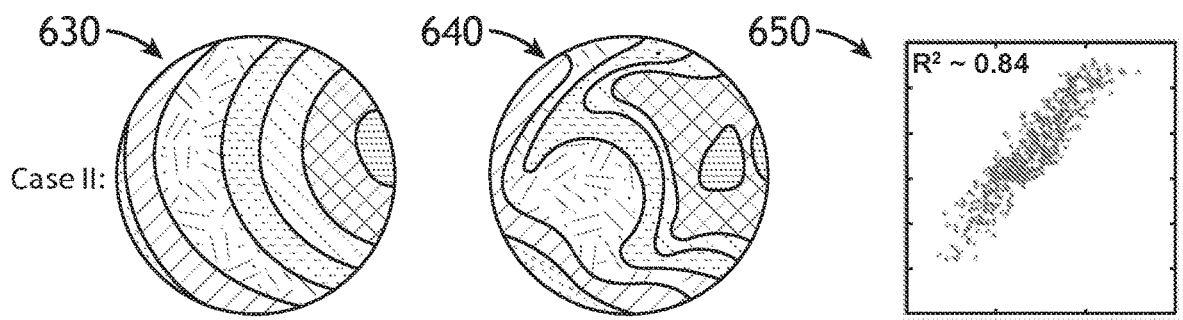
FIG. 6B illustrates a graph set of a test case for process-induced displacement characterization during semiconductor production, in accordance with one or more embodiments of the present disclosure.
Figure 6C:
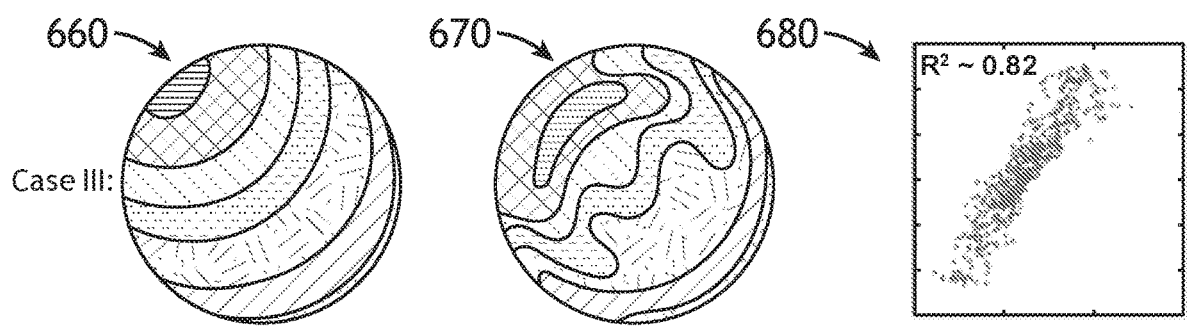
FIG. 6C illustrates a graph set of a test case for process-induced displacement characterization during semiconductor production, in accordance with one or more embodiments of the present disclosure.

It is noted herein that film force may be defined as the product of film thickness (t) and film stress. In addition, it is noted herein that variations in film stress across a sample 104 and variations in the real component of the index of refraction (n) and the complex component of the index of refraction (k) in the film across the sample 104 are directly related. FIGS. 6A-6C generally illustrate the direct relationship via graph sets for several test cases.

FIG. 6A illustrates a first test case, where the film stress is concentrated in the lower left of a sample. In the first test case, film force simulated from reference data is illustrated in graph 600, while film force estimated from characterizations is illustrated in graph 610. The simulated film force and the estimated film force in the first test case has a correlation $R^2$ of approximately 0.90, which is illustrated in graph 620.

FIG. 6B illustrates a second test case, where the film stress is concentrated in the upper right of a sample. In the second test case, film force simulated from reference data is illustrated in graph 630, while film force estimated from characterizations is illustrated in graph 640. The simulated film force and the estimated film force in the second test case has a correlation $R^2$ of approximately 0.84, which is illustrated in graph 650.

FIG. 6C illustrates a third test case, where the film stress is concentrated in on the upper left of a sample. In the third test case, film force simulated from reference data is illustrated in graph 660, while film force estimated from characterizations is illustrated in graph 670. The simulated film force and the estimated film force in the third test case has a correlation $R^2$ of approximately 0.82, which is illustrated in graph 680.

As such, the refractive index for a sample 104 may be calibrated against reference data obtained for a calibration sample set, and the real component of the index of refraction (n), and the complex component of the index of refraction (k) characterizations obtained via the reflection-mode characterization tool 110 may be utilized to estimate film stress. In addition, the film force for the sample 104 may be determined from the product of the film stress estimated from the real component of the index of refraction (n), and the complex component of the index of refraction (k), and the film thickness (t). In this regard, the IPD may be estimated using the estimated film force determined from the TNK measurements (e.g., via finite-element analysis models (FEM), or the like).

A description of estimating IPD from film force via FEM is found in K. T. Turner, et al., *Monitoring Process-Induced Overlay Errors Through High Resolution Wafer Geometry Measurements*, Proceedings of SPIE, Vol. 9050, p. 905013, 2014, previously incorporated herein by reference in the entirety. In addition, a description of estimating IPD from film force via FEM is found in K. T. Turner, et al., *Models to Relate Wafer Geometry Measurements to In-Plane Distortion of Wafers*, Journal of Micro/Nanolithography, MEMS, and MOEMS (JM3), 15(2), p. 021404, 2016, which is incorporated herein by reference in the entirety.

Figure 7A:
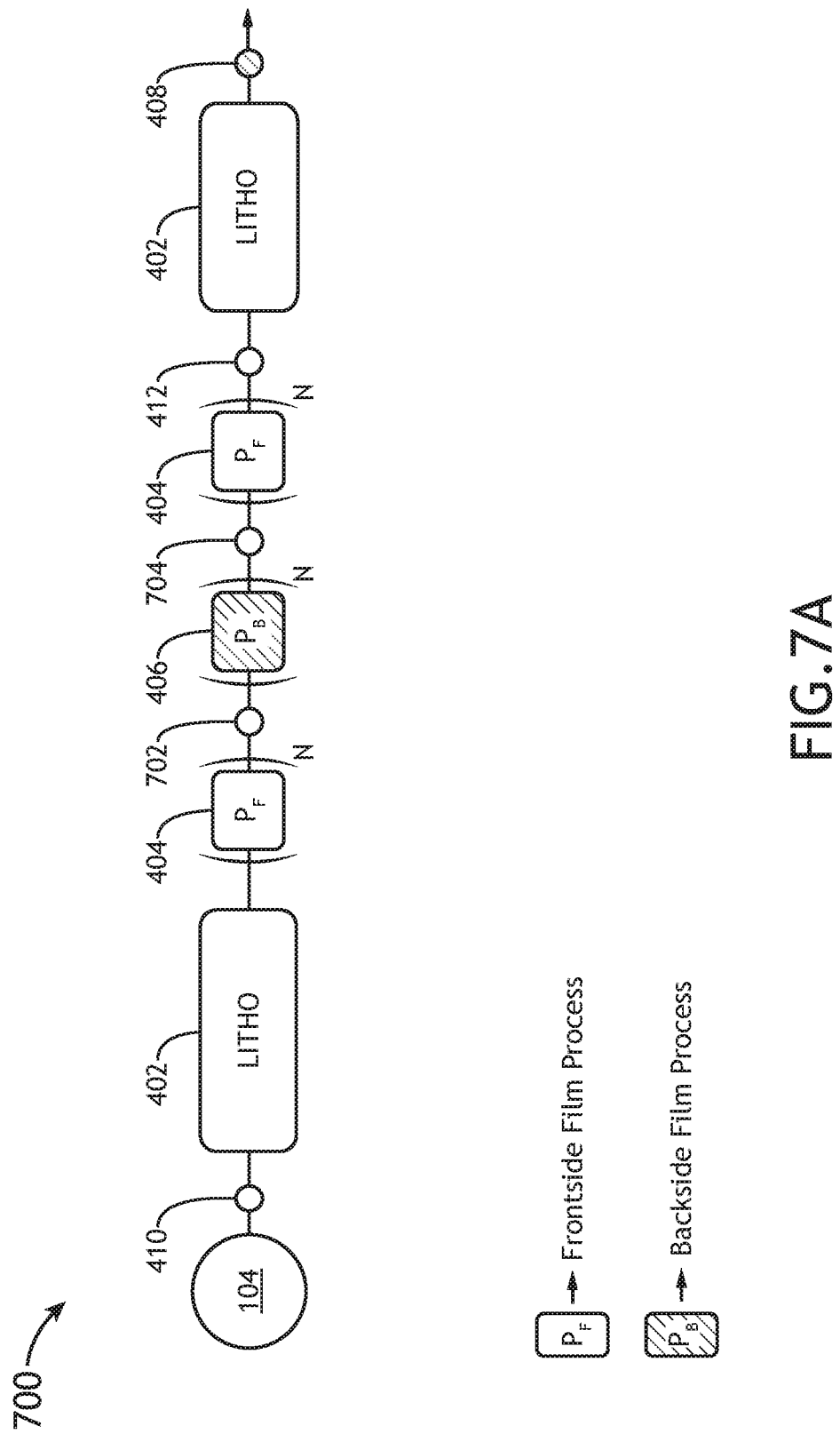
FIG. 7A illustrates a simplified block diagram of process-induced displacement characterization during semiconductor production, in accordance with one or more embodiments of the present disclosure.

Referring now to FIG. 7A, the semiconductor production process 700 includes one or more intermediate intensity spectra (IS) characterization processes in addition to the one or more wafer geometry characterization processes 410, 412. For example, the one or more wafer geometry characterization processes 410, 412 may be performed via the interferometer tool 108, while the one or more IS characterization processes may be performed via the reflection-mode characterization tool 110. In one embodiment, the semiconductor production process 700 includes a set of one or more IS characterization processes 702 prior to the one or more discrete backside film processes 406. In another embodiment, the semiconductor production process 700 includes a set of one or more IS characterization processes 704 following the one or more discrete backside film processes 406. In this regard, the one or more IS characterization processes 702, 704 may characterize the total effect the one or more discrete backside film processes 406 has on the film force/stress of the sample 104 in a single IS characterization process.

Figure 7B:
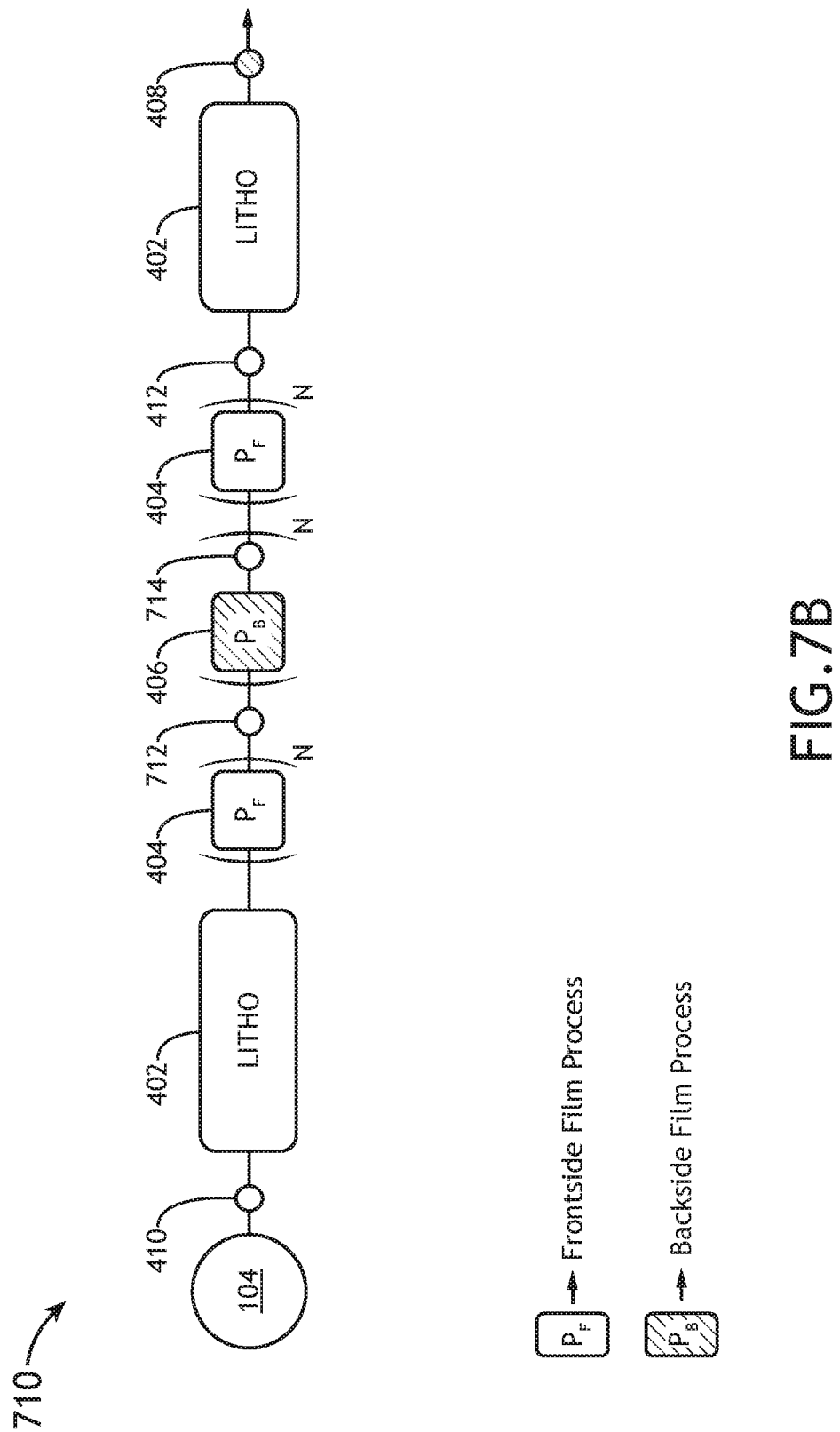
FIG. 7B illustrates a simplified block diagram of process-induced displacement characterization during semiconductor production, in accordance with one or more embodiments of the present disclosure.

Referring now to FIG. 7B, the semiconductor production process 710 includes one or more intermediate IS characterization processes in addition to the one or more wafer geometry characterization processes 410, 412. For example, the one or more wafer geometry characterization processes 410, 412 may be performed via the interferometer tool 108, while the one or more IS characterization processes may be performed via the reflection-mode characterization tool 110. In one embodiment, the semiconductor production process 710 includes a set of one or more IS characterization processes 712 prior to the one or more discrete backside film processes 406. In another embodiment, the semiconductor production process 710 includes a set of one or more IS characterization processes 714 following each discrete backside film process 406 of the one or more discrete backside film processes 406. In this regard, the one or more IS characterization processes 712, 714 may characterize the effect each discrete backside film process of the one or more discrete backside film processes 406 separately has on the film force/stress of the sample 104, at the expense of cycle time due to the increased number of IS characterization processes.

It is noted herein that IS characterizations include information necessary to estimate film thickness (t), the real component of the index of refraction (n), and the complex component of the index of refraction (k) of a sample 104. In this regard, IS characterization processes may result in the information necessary to estimate film force, similar to TNK characterization processes.

Figure 8A:
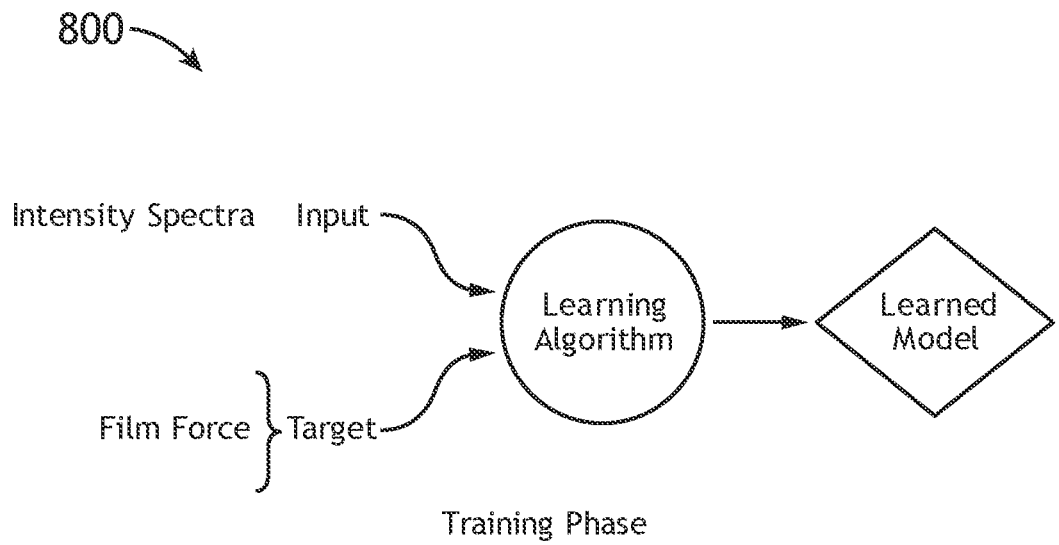
FIG. 8A illustrates a simplified block diagram of a training phase for process-induced displacement characterization during semiconductor production, in accordance with one or more embodiments of the present disclosure.
Figure 8B:
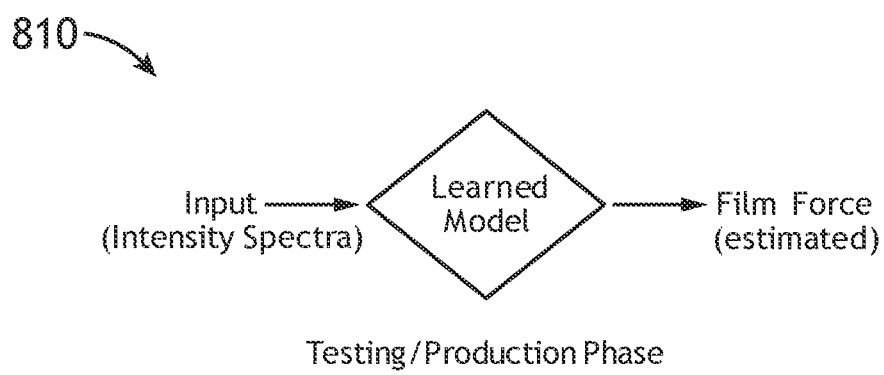
FIG. 8B illustrates a simplified block diagram of a testing/production phase for process-induced displacement characterization during semiconductor production, in accordance with one or more embodiments of the present disclosure.

FIGS. 8A and 8B generally illustrate phases of a learning-based process for purposes of the present disclosure. In one embodiment, learning-based processes (e.g., linear regression, neural networks, deep neural networks, or the like) may be implemented to predict film force based on IS characterizations.

In a training phase 800, as illustrated in FIG. 8A, IS characterizations and film force reference data are inputted into a learning algorithm. For example, the IS characterizations and/or the film force reference data may include data for multiple types of films and/or samples. The learning algorithm generates a learned model based on the inputted IS characterizations and film force reference data.

In a testing/production phase 810, as illustrated in FIG. 8B, IS characterizations are inputted into the learned model. The learned model generates an estimated film force based on the inputted IS characterizations, which may subsequently be used to estimate IPD.

A description of learning-based processes is found in D. C. Montgomery, et al., *Introduction to Linear Regression Analysis*, New York: Wiley, 2001, which is incorporated herein by reference in the entirety. In addition, a description of learning-based processes is found in I. Goodfellow, et al., *Deep Learning*, The MIT Press, 2016, which is incorporated herein by reference in the entirety.

Figure 9:
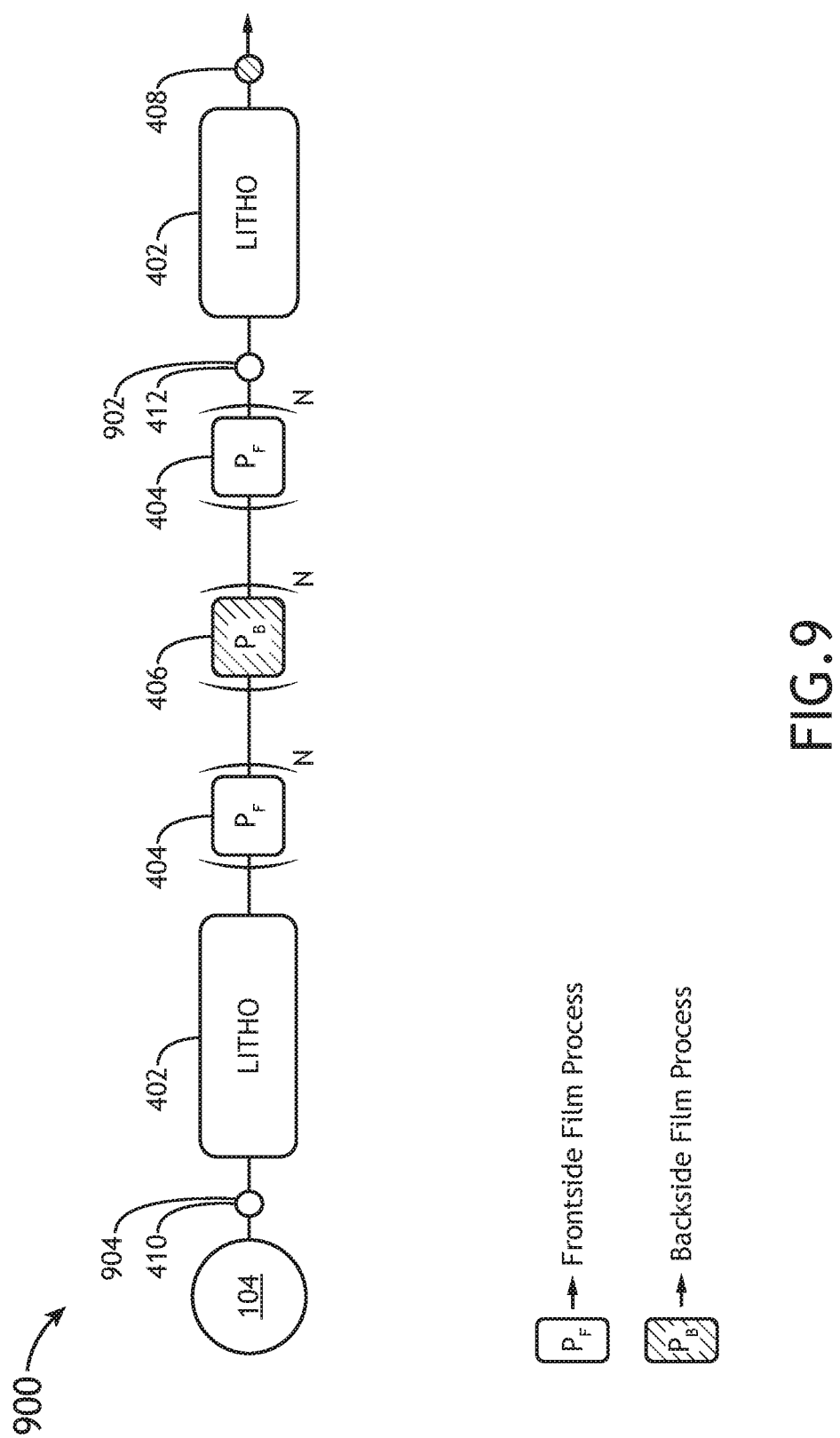
FIG. 9 illustrates a simplified block diagram of process-induced displacement characterization during semiconductor production, in accordance with one or more embodiments of the present disclosure.

Referring now to FIG. 9, the semiconductor production process 900 includes one or more intermediate TNK characterization processes and/or one or more IS characterization processes in addition to the one or more wafer geometry characterization processes 410, 412. For example, the one or more wafer geometry characterization processes 410, 412 may be performed via the interferometer tool 108, while the one or more TNK characterization processes and/or the one or more IS characterization processes may be performed via the reflection-mode characterization tool 110. In one embodiment, the semiconductor production process 900 includes a set of one or more TNK characterization processes and/or one or more IS characterization processes 902 at the end of layer production, prior to the additional lithography process 402 and alongside the one or more wafer geometry characterization processes 412. In another embodiment, the semiconductor production process 900 includes a set of one or more TNK characterization processes and/or one or more IS characterization processes 904 at the beginning of layer production, prior to the first lithography process 402 and alongside the one or more wafer geometry characterization processes 410. It is noted herein the one or more TNK characterization processes and/or the one or more IS characterization processes 904 may be performed in addition to, or as an alternative to, the one or more TNK characterization processes and/or the one or more IS characterization processes 902.

It is noted herein that the principles of operation of a reflection-mode characterization process (e.g., reflectometry, spectroscopic ellipsometry, or the like) allows for the obtaining of film properties of multiple stacks of films (e.g., discrete frontside films, discrete backside films, or the like) via a single characterization process. Therefore, the above description should not be interpreted as a limitation on the scope of the present disclosure but merely an illustration.

Figure 10:
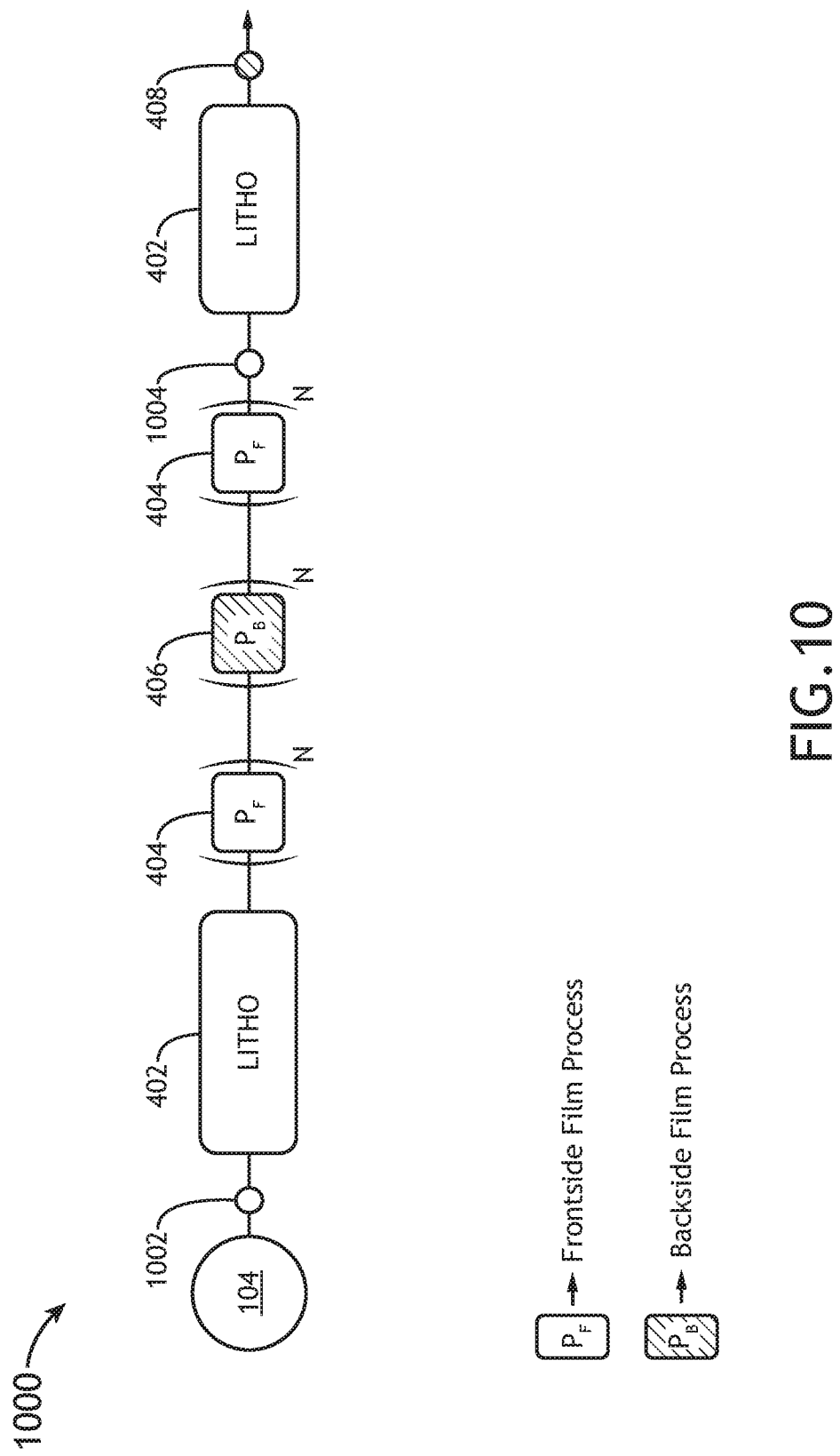
FIG. 10 illustrates a simplified block diagram of process-induced displacement characterization during semiconductor production, in accordance with one or more embodiments of the present disclosure.

Referring now to FIG. 10, the semiconductor production process 1000 includes one or more TNK characterization processes and/or one or more IS characterization processes instead of the one or more wafer geometry characterization processes 410, 412. For example, the one or more TNK characterization processes and/or the one or more IS characterization processes may be performed via the reflection-mode characterization tool 110. In one embodiment, the semiconductor production process 1000 includes a set of one or more TNK characterization processes and/or one or more IS characterization processes 1002 at the beginning of layer production, prior to the first lithography process 402. In another embodiment, the semiconductor production process 1000 includes a set of one or more TNK characterization processes and/or one or more IS characterization processes 1004 at the end of layer production, prior to the additional lithography process 402.

It is noted herein that semiconductor production process 1000 includes one or more wafer geometry characterization processes performed to obtain reference data utilized for calibration (e.g., as used in semiconductor production processes 500, 510, 700, 710) and/or for model training (e.g., as used in semiconductor production process 900). In this regard, the film force characterization of the sample is obtained only via the one or more TNK characterizations and/or the one or more IS characterizations 1002, 1004 with no wafer geometry characterization processes, aside from any calibration processes and/or model training processes.

Although embodiments of the present disclosure are directed to the semiconductor production process 1000 as illustrated in FIG. 10, it is noted herein that any of the semiconductor production processes 400, 420, 500, 510, 700, 710, 900 may be modified and/or adjusted to include the one or more TNK characterization processes and/or the one or more IS characterization processes 1002, 1004 in addition to, or instead of, the one or more wafer geometry characterization processes 410, 412. Therefore, the above description should not be interpreted as a limitation on the scope of the present disclosure but merely an illustration.

Although embodiments of the present disclosure are directed to the one or more frontside film processes 404 and the one or more backside film processes 406, where the one or more backside film processes 406 are discrete backside film processes, the one or more film deposition processes may include one or more concurrent backside film processes and frontside film processes that are processed simultaneously or substantially simultaneously. It is noted herein the one or more concurrent backside film processes may be unintentionally processed as a by-product (e.g., thermal growth in a furnace, etc.) of frontside film processes.

Figure 11A:
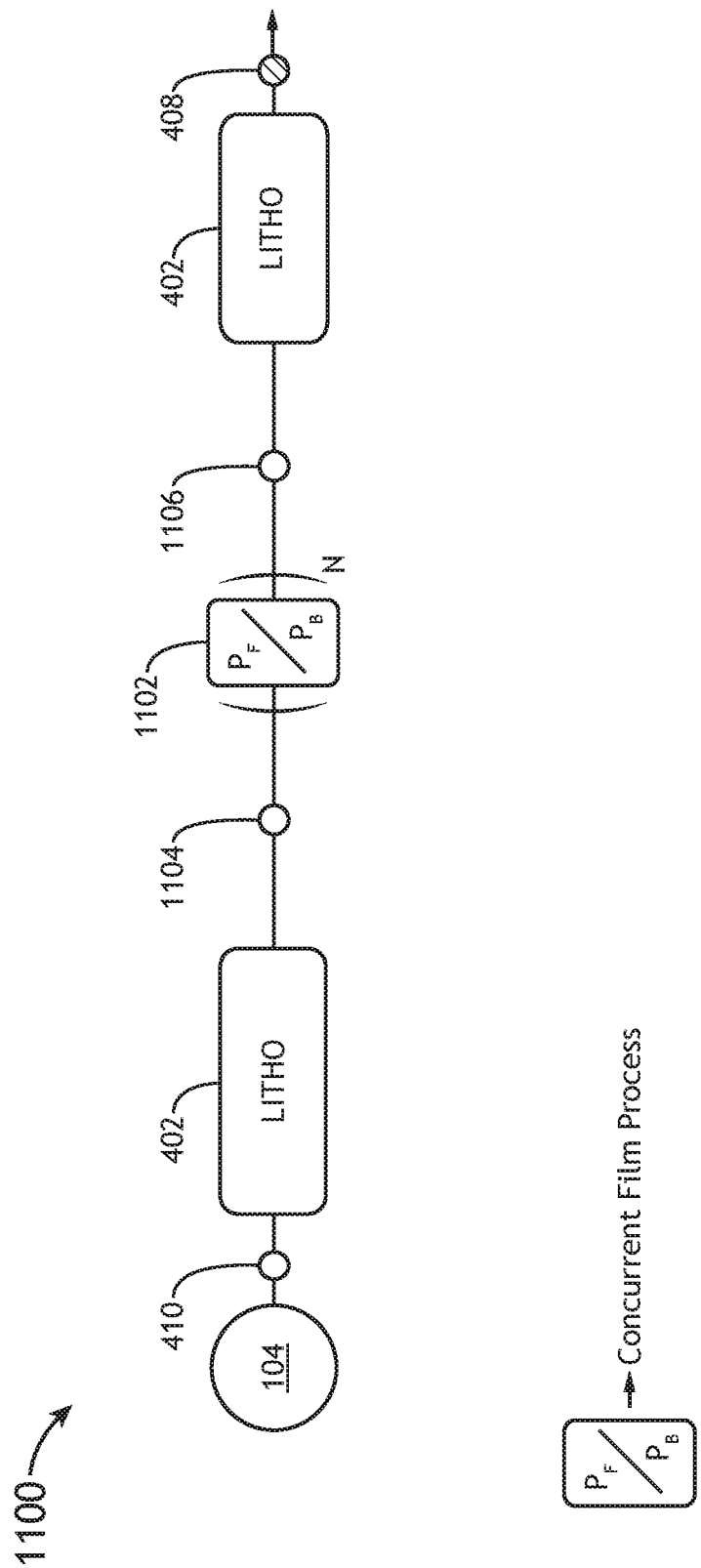
FIG. 11A illustrates a simplified block diagram of process-induced displacement characterization during semiconductor production, in accordance with one or more embodiments of the present disclosure.
Figure 11B:
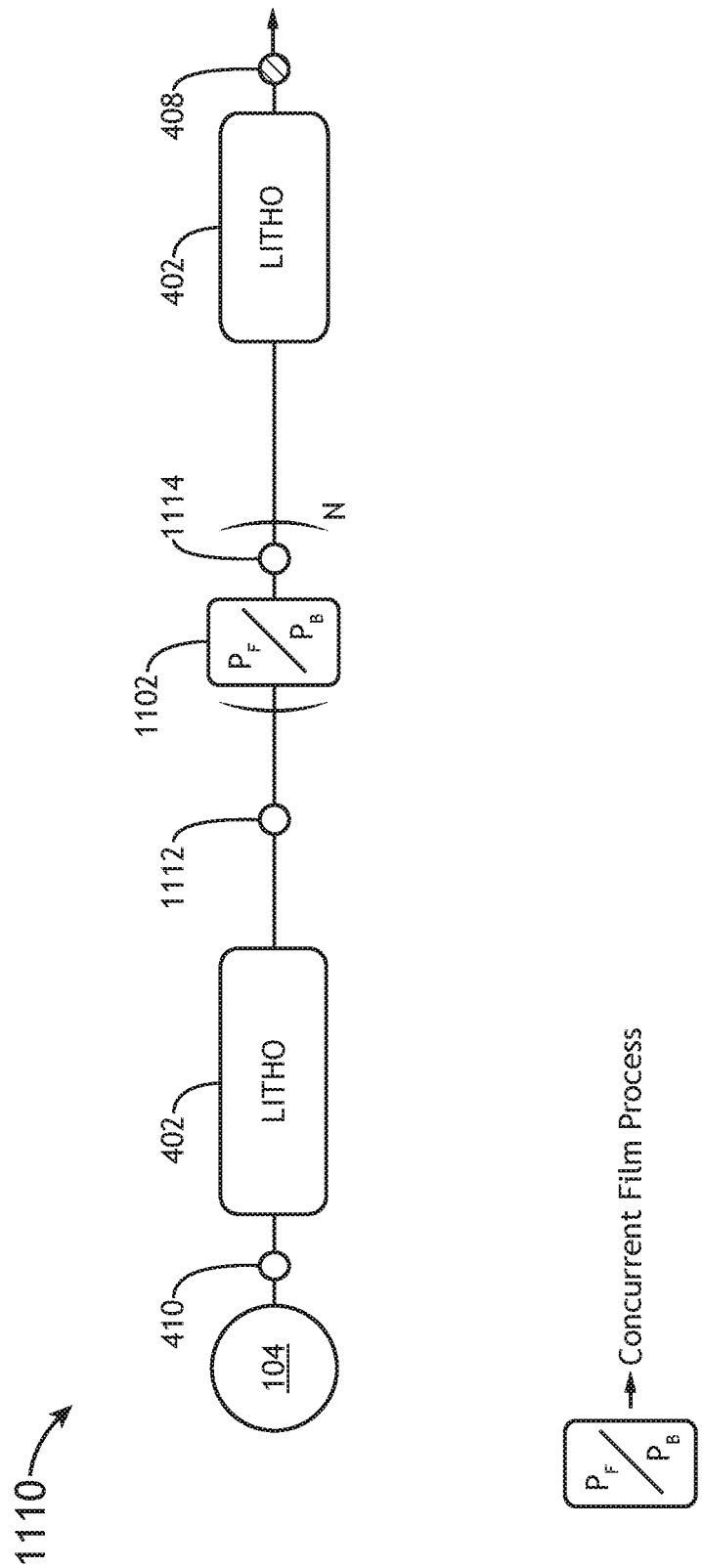
FIG. 11B illustrates a simplified block diagram of process-induced displacement characterization during semiconductor production, in accordance with one or more embodiments of the present disclosure.

Referring generally to FIGS. 11A and 11B, process-induced displacement characterization during semiconductor production processes is illustrated, in accordance with one or more embodiments of the present disclosure.

In one embodiment, the semiconductor production processes include one or more concurrent film processes 1102. For example, the semiconductor production process 1100 may include up to an N number of concurrent film processes 1102. In another embodiment, the semiconductor production processes include one or more semiconductor characterization processes. In another embodiment, the semiconductor characterization processes include a set of one or more semiconductor characterization processes that monitor and control the film force/stress-induced in-plane displacements. For example, the semiconductor characterization processes may measure changes in wafer geometry (WG)/patterned wafer geometry (PWG); film properties (TNK) including thickness (t), the real component of the index of refraction (n), and the complex component of the index of refraction (k); and/or intensity spectra (IS).

Referring now to FIG. 11A, the semiconductor production process 1100 includes one or more intermediate characterization processes. For example, the semiconductor production process 1100 may be performed via the interferometer tool 108 and/or the reflection-mode characterization tool 110. In one embodiment, the semiconductor production process 1100 includes a set of one or more characterization processes 1104 prior to the one or more concurrent film processes 1102. In another embodiment, the semiconductor production process 1100 includes a set of one or more characterization processes 1106 following the one or more concurrent film processes 1102. In this regard, the one or more characterization processes 1104, 1106 may characterize the total effect the one or more concurrent film processes 1102 has on the film force/stress of the sample 104 in a single characterization process.

Referring now to FIG. 11B, the semiconductor production process 1110 includes one or more intermediate characterization processes. For example, the semiconductor production process 1110 may be performed via the interferometer tool 108 and/or the reflection-mode characterization tool 110. In one embodiment, the semiconductor production process 1110 includes a set of one or more characterization processes 1112 prior to the one or more concurrent film processes 1102. In another embodiment, the semiconductor production process 1110 includes a set of one or more characterization processes 1114 following each concurrent film process 1102 of the one or more concurrent film processes 1102. In this regard, the one or more characterization processes 1112, 1114 may characterize the effect each concurrent film process 1102 of the one or more concurrent film processes 1102 separately has on the film force/film stress of the sample 104, at the expense of cycle time due to the increased number of characterization processes.

Advantages of the present disclosure include a system and method for process-induced displacement characterization during semiconductor production. Advantages of the present disclosure also include estimating IPDs induced by film processes via one or more of wafer geometry characterization processes, film properties characterization processes, and/or intensity spectra characterization processes during semiconductor fabrication. Advantages of the present disclosure also include improving cycle time via integration of characterization techniques and subsequent elimination of characterization at multiple steps, allowing for the characterization of multiple stacks of films via a single characterization process. Advantages of the present disclosure also include controlling process tools and/or characterization tools based on an estimated film force and/or in-plane displacements.

Those having skill in the art will recognize that the state of the art has progressed to the point where there is little distinction left between hardware, software, and/or firmware implementations of aspects of systems; the use of hardware, software, and/or firmware is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be affected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be affected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and/or firmware.

In some implementations described herein, logic and similar implementations may include software or other control structures. Electronic circuitry, for example, may have one or more paths of electrical current constructed and arranged to implement various functions as described herein. In some implementations, one or more media may be configured to bear a device-detectable implementation when such media hold or transmit device-detectable instructions operable to perform as described herein. In some variants, for example, implementations may include an update or modification of existing software or firmware, or of gate arrays or programmable hardware, such as by performing a reception of or a transmission of one or more instructions in relation to one or more operations described herein. Alternatively or in addition, in some variants, an implementation may include special-purpose hardware, software, firmware components, and/or general-purpose components executing or otherwise invoking special-purpose components. Specifications or other implementations may be transmitted by one or more instances of tangible transmission media as described herein, optionally by packet transmission or otherwise by passing through distributed media at various times.

Alternatively, or in addition, implementations may include executing a special-purpose instruction sequence or invoking circuitry for enabling, triggering, coordinating, requesting, or otherwise causing one or more occurrences of virtually any functional operations described herein. In some variants, operational or other logical descriptions herein may be expressed as source code and compiled or otherwise invoked as an executable instruction sequence. In some contexts, for example, implementations may be provided, in whole or in part, by source code, such as C++, or other code sequences. In other implementations, source or other code implementation, using commercially available and/or techniques in the art, may be compiled//implemented/translated/converted into a high-level descriptor language (e.g., initially implementing described technologies in C, C++, python, Ruby on Rails, Java, PHP, .NET, or Node.js programming language and thereafter converting the programming language implementation into a logic-synthesizable language implementation, a hardware description language implementation, a hardware design simulation implementation, and/or other such similar mode(s) of expression). For example, some or all of a logical expression (e.g., computer programming language implementation) may be manifested as a Verilog-type hardware description (e.g., via Hardware Description Language (HDL) and/or Very High Speed Integrated Circuit Hardware Descriptor Language (VHDL)) or other circuitry model which may then be used to create a physical implementation having hardware (e.g., an Application Specific Integrated Circuit). Those skilled in the art will recognize how to obtain, configure, and optimize suitable transmission or computational elements, material supplies, actuators, or other structures in light of these teachings.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link (e.g., transmitter, receiver, transmission logic, reception logic, etc.).

In a general sense, those skilled in the art will recognize that the various embodiments described herein can be implemented, individually and/or collectively, by various types of electro-mechanical systems having a wide range of electrical components such as hardware, software, firmware, and/or virtually any combination thereof; and a wide range of components that may impart mechanical force or motion such as rigid bodies, spring or torsional bodies, hydraulics, electro-magnetically actuated devices, and/or virtually any combination thereof. Consequently, as used herein "electro-mechanical system" includes, but is not limited to, electrical circuitry operably coupled with a transducer (e.g., an actuator, a motor, a piezoelectric crystal, a Micro Electro Mechanical System (MEMS), etc.), electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of memory (e.g., random access, flash, read only, etc.)), electrical circuitry forming a communications device (e.g., a modem, communications switch, optical-electrical equipment, etc.), and/or any non-electrical analog thereto, such as optical or other analogs. Those skilled in the art will also appreciate that examples of electro-mechanical systems include but are not limited to a variety of consumer electronics systems, medical devices, as well as other systems such as motorized transport systems, factory automation systems, security systems, and/or communication/computing systems. Those skilled in the art will recognize that electro-mechanical as used herein is not necessarily limited to a system that has both electrical and mechanical actuation except as context may dictate otherwise.

In a general sense, those skilled in the art will recognize that the various aspects described herein which can be implemented, individually and/or collectively, by a wide range of hardware, software, firmware, and/or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of memory (e.g., random access, flash, read only, etc.)), and/or electrical circuitry forming a communications device (e.g., a modem, communications switch, optical-electrical equipment, etc.). Those having skill in the art will recognize that the subject matter described herein may be implemented in an analog or digital fashion or some combination thereof.

Those skilled in the art will recognize that at least a portion of the devices and/or processes described herein can be integrated into a data processing system. Those having skill in the art will recognize that a data processing system generally includes one or more of a system unit housing, a video display device, memory such as volatile or non-volatile memory, processors such as microprocessors or digital signal processors, computational entities such as operating systems, drivers, graphical user interfaces, and applications programs, one or more interaction devices (e.g., a touch pad, a touch screen, an antenna, etc.), and/or control systems including feedback loops and control motors (e.g., feedback for sensing position and/or velocity; control motors for moving and/or adjusting components and/or quantities). A data processing system may be implemented utilizing suitable commercially available components, such as those typically found in data computing/communication and/or network computing/communication systems.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken limiting.

Although a user is described herein as a single figure, those skilled in the art will appreciate that the user may be representative of a human user, a robotic user (e.g., computational entity), and/or substantially any combination thereof (e.g., a user may be assisted by one or more robotic agents) unless context dictates otherwise. Those skilled in the art will appreciate that, in general, the same may be said of "sender" and/or other entity-oriented terms as such terms are used herein unless context dictates otherwise.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components, and/or wirelessly interactable, and/or wirelessly interacting components, and/or logically interacting, and/or logically interactable components.

In some instances, one or more components may be referred to herein as "configured to," "configurable to," "operable/operative to," "adapted/adaptable," "able to," "conformable/conformed to," etc. Those skilled in the art will recognize that such terms (e.g., "configured to") can generally encompass active-state components and/or inactive-state components and/or standby-state components, unless context requires otherwise.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

With respect to the appended claims, those skilled in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

Although particular embodiments of this invention have been illustrated, it is apparent that various modifications and embodiments of the invention may be made by those skilled in the art without departing from the scope and spirit of the foregoing disclosure. It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Accordingly, the scope of the invention should be limited only by the claims appended hereto.

What is claimed:
1. A system, comprising:
   a controller, wherein the controller includes one or more processors and memory configured to store one or more sets of program instructions, wherein the one or more processors are configured to execute the one or more sets of program instructions, wherein the one or more sets of program instructions are configured to cause the one or more processors to:

perform a first wafer geometry characterization process via at least one tool of one or more characterization sub-systems prior to a first lithography process on a semiconductor wafer;

perform at least one characterization process via at least one reflection-mode characterization tool of the one or more characterization sub-systems following the first lithography process and prior to at least one discrete backside film deposition process on the semiconductor wafer, wherein the at least one characterization process comprises at least one of a film property characterization process or an intensity spectra characterization process;

perform at least one additional characterization process via at least one reflection-mode characterization tool of the one or more characterization sub-systems following the at least one discrete backside film deposition process on the semiconductor wafer and prior to a second lithography process, wherein the at least one additional characterization process comprises at least one of a film property characterization process or an intensity spectra characterization process;

perform a second wafer geometry characterization process via at least one tool of the one or more characterization sub-systems prior to the second lithography process on the semiconductor wafer;

determine at least one of a film force or one or more in-plane displacements for at least one discrete backside film deposited on the semiconductor wafer via the at least one discrete backside film deposition process based on at least one of the first wafer geometry characterization process, the at least one characterization process, the at least one additional characterization process, or the second wafer geometry characterization process; and provide at least one of the film force or the one or more in-plane displacements to at least one process tool via at least one of a feed forward loop or a feedback loop to improve performance of one or more fabrication processes.

2. The system of claim 1, wherein the one or more film property characterization processes are configured to characterize at least one of a thickness, a real component of an index of refraction, or a complex component of the index of refraction of the at least one discrete backside film deposited on the semiconductor wafer via the at least one discrete backside film deposition process.

3. The system of claim 1, wherein at least one of the at least one characterization process or the at least one additional characterization process further comprise one or more wafer geometry characterization processes on the semiconductor wafer.

4. The system of claim 1, wherein the at least one process tool is configured to perform the one or more fabrication processes on the semiconductor wafer.

5. The system of claim 1, wherein the at least one process tool comprises at least one film deposition tool configured to perform one or more discrete frontside film deposition processes on the semiconductor wafer.

6. The system of claim 1, wherein the at least one process tool comprises at least one film deposition tool configured to perform one or more discrete backside film deposition processes on the semiconductor wafer.

7. The system of claim 1, wherein the at least one process tool comprises at least one lithography tool configured to perform one or more lithography processes on the semiconductor wafer.

8. The system of claim 1, wherein the at least one tool of the one or more characterization sub-systems performing the first wafer geometry characterization process and the at least one reflection-mode characterization tool are integrated into a common tool.

9. The system of claim 1, wherein the at least one tool of the one or more characterization sub-systems performing the first wafer geometry characterization process and the at least one reflection-mode characterization tool are stand-alone characterization tools.

10. The system of claim 1, wherein the one or more sets of program instructions are further configured to cause the one or more processors to:

provide at least one of the film force or the one or more in-plane displacements to the one or more characterization sub-systems via at least one of the feed forward loop or the feedback loop to improve performance of the at least the at least one characterization process or the at least one additional characterization process.

11. A system, comprising:
one or more characterization sub-systems; and
a controller, wherein the controller includes one or more processors and memory configured to store one or more sets of program instructions, wherein the one or more processors are configured to execute the one or more sets of program instructions, wherein the one or more sets of program instructions are configured to cause the one or more processors to:

perform a first wafer geometry characterization process via at least one tool of the one or more characterization sub-systems prior to a first lithography process on a semiconductor wafer;

perform at least one characterization process via at least one reflection-mode characterization tool of the one or more characterization sub-systems following the first lithography process and prior to at least one discrete backside film deposition process on the semiconductor wafer, wherein the at least one characterization process comprises at least one of a film property characterization process or an intensity spectra characterization process;

perform at least one additional characterization process via at least one reflection-mode characterization tool of the one or more characterization sub-systems following the at least one discrete backside film deposition process on the semiconductor wafer and prior to a second lithography process, wherein the at least one additional characterization process comprises at least one of a film property characterization process or an intensity spectra characterization process;

perform a second wafer geometry characterization process via at least one tool of the one or more characterization sub-systems prior to the second lithography process on the semiconductor wafer;

determine at least one of a film force or one or more in-plane displacements for at least one discrete backside film deposited on the semiconductor wafer via the at least one discrete backside film deposition process based on at least one of the first wafer geometry characterization process, the at least one characterization process, the at least one additional characterization process, or the second wafer geometry characterization process; and provide at least one of the film force or the one or more in-plane displacements to at least one process tool via at least one of a feed forward loop or a feedback loop to improve performance of one or more fabrication processes.

12. The system of claim 11, wherein the one or more sets of program instructions are further configured to cause the one or more processors to:

provide at least one of the film force or the one or more in-plane displacements to the one or more characterization sub-systems via at least one of the feed forward loop or the feedback loop to improve performance of the at least the at least one characterization process or the at least one additional characterization process.

13. A method, comprising:

performing a first wafer geometry characterization process via at least one tool of one or more characterization sub-systems prior to a first lithography process on a semiconductor wafer;

performing at least one characterization process via at least one reflection-mode characterization tool of the one or more characterization sub-systems following the first lithography process and prior to at least one discrete backside film deposition process on the semiconductor wafer, wherein the at least one characterization process comprises at least one of a film property characterization process or an intensity spectra characterization process;

performing at least one additional characterization process via at least one reflection-mode characterization tool of the one or more characterization sub-systems following the at least one discrete backside film deposition process on the semiconductor wafer and prior to a second lithography process, wherein the at least one additional characterization process comprises at least one of a film property characterization process or an intensity spectra characterization process;

performing a second wafer geometry characterization process via at least one tool of the one or more characterization sub-systems prior to the second lithography process on the semiconductor wafer;

determining at least one of a film force or one or more in-plane displacements for at least one discrete backside film deposited on the semiconductor wafer via the at least one discrete backside film deposition process based on at least one of the first wafer geometry characterization process, the at least one characterization process, the at least one additional characterization process, or the second wafer geometry characterization process; and providing at least one of the film force or the one or more in-plane displacements to at least one process tool via at least one of a feed forward loop or a feedback loop to improve performance of one or more fabrication processes.

14. The method of claim 13, wherein the one or more film property characterization processes are configured to characterize at least one of a thickness, a real component of an index of refraction, or a complex component of the index of refraction of the at least one discrete backside film deposited on the semiconductor wafer via the at least one discrete backside film deposition process.

15. The method of claim 13, wherein the at least one characterization process includes one or more semiconductor characterization processes performed prior to the at least one discrete backside film deposition process on the semiconductor wafer, wherein the at least one additional characterization process includes one or more semiconductor characterization processes performed following the at least one discrete backside film deposition process on the semiconductor wafer.

16. The method of claim 13, wherein the at least one characterization process includes one or more semiconductor characterization processes performed prior to the at least one discrete backside film deposition process on the semiconductor wafer, wherein the at least one additional characterization process includes one or more semiconductor characterization processes performed following each discrete backside film deposition process of the at least one discrete backside film deposition process on the semiconductor wafer.

17. The method of claim 13, wherein the semiconductor process further includes at least one discrete frontside film deposition process on the semiconductor wafer.

18. The method of claim 17, wherein the at least one discrete frontside film deposition process includes one or more discrete frontside film deposition processes following the first lithography process and prior to the at least one discrete backside film process on the semiconductor wafer, wherein the at least one characterization process is performed following the one or more discrete frontside film deposition processes.

19. The method of claim 17, wherein the at least one discrete frontside film deposition process includes one or more discrete frontside film deposition processes following the at least one discrete backside film process and prior to the second lithography process on the semiconductor wafer, wherein the at least one additional characterization process is performed prior to the one or more discrete frontside film deposition processes.

20. The method of claim 13, wherein at least one of the at least one characterization process or the at least one additional characterization process further comprise one or more wafer geometry characterization processes on the semiconductor wafer.

21. The method of claim 20, wherein the semiconductor production process further includes one or more lithography processes on the semiconductor wafer.

22. The method of claim 21, wherein the one or more lithography processes include a first lithography process prior to the at least one discrete backside film process on the semiconductor wafer.

23. The method of claim 22, wherein the at least one characterization process includes one or more semiconductor characterization processes prior to the first lithography process on the semiconductor wafer.

24. The method of claim 23, wherein the one or more lithography processes includes an additional lithography process following the at least one discrete backside film process on the semiconductor wafer.

25. The method of claim 24, wherein the at least one additional characterization process includes one or more semiconductor characterization processes prior to the additional lithography process on the semiconductor wafer.

26. The method of claim 21, wherein the one or more of the at least one discrete frontside film deposition process, the at least one discrete backside film deposition process, or the at least one lithography process is performed via the at least one process tool.

27. The method of claim 13, further comprising:

providing at least one of the film force or the one or more in-plane displacements to the one or more characterization sub-systems via at least one of the feed forward loop or the feedback loop to improve performance of the at least the at least one characterization process or the at least one additional characterization process.

* * * * *